US012471372B2

(12) United States Patent
Guo et al.

(10) Patent No.: US 12,471,372 B2
(45) Date of Patent: Nov. 11, 2025

(54) BACK PLATE AND ANODE BACK PLATE FOR 3D PRINTING

(71) Applicant: BOE Technology Group Co., Ltd., Beijing (CN)

(72) Inventors: Yitong Guo, Beijing (CN); Jian Zhou, Beijing (CN); Tuo Sun, Beijing (CN); Xiaochun Xu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 648 days.

(21) Appl. No.: 17/770,590

(22) PCT Filed: Mar. 15, 2021

(86) PCT No.: PCT/CN2021/080744
§ 371 (c)(1),
(2) Date: Apr. 20, 2022

(87) PCT Pub. No.: WO2022/062330
PCT Pub. Date: Mar. 31, 2022

(65) Prior Publication Data
US 2023/0021559 A1 Jan. 26, 2023

(30) Foreign Application Priority Data

Sep. 25, 2020 (CN) .......................... 202011023517.4
Sep. 25, 2020 (CN) .......................... 202011023605.4
Sep. 25, 2020 (CN) .......................... 202011025488.5

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC ............................ H10D 86/60; H10D 86/441
See application file for complete search history.

(56) References Cited

U.S. PATENT DOCUMENTS

| 12,211,425 B2 * | 1/2025 | Sun ........................ H10D 86/00 |
| 2005/0140308 A1 * | 6/2005 | Park ...................... H10K 59/131 |
| | | 315/169.3 |

(Continued)

FOREIGN PATENT DOCUMENTS

| CN | 1638569 A | 7/2005 |
| CN | 102636927 A | 8/2012 |

(Continued)

OTHER PUBLICATIONS

International Search Report & Written Opinion mailed Jun. 23, 2021, regarding PCT/CN2021/080744; English translation attached.

(Continued)

*Primary Examiner* — Jeff W Natalini
*Assistant Examiner* — Alexander Belousov
(74) *Attorney, Agent, or Firm* — Intellectual Valley Law, P.C.

(57) ABSTRACT

A back plate includes a base substrate, gate lines, data lines and power supply lines arranged on the base substrate crossing each other in rows and columns, and pixel structures arranged in an array on the base substrate, each pixel structure includes a driving transistor, a switching transistor connected thereto, and a pixel electrode connected thereto; a gate line and a data line are connected to the switching transistor, and a power supply line is connected to the driving transistor; in a same row or column of pixel structures, a power supply line is arranged between an (2n−1)th pixel structure and an 2n-th pixel structure, and the power supply line is connected to a source electrode of a driving transistor in the (2n−1)th pixel structure and a source elec- (Continued)

trode of a driving transistor in the 2n-th pixel structure; n is a positive integer greater than or equal to 1.

19 Claims, 9 Drawing Sheets

(56) References Cited

U.S. PATENT DOCUMENTS

| | | | |
|---|---|---|---|
| 2008/0272703 A1 | 11/2008 | Chan et al. | |
| 2013/0187167 A1 | 7/2013 | Jin et al. | |
| 2014/0054562 A1 | 2/2014 | Lee | |
| 2014/0167036 A1* | 6/2014 | Cheng | H10D 99/00 257/43 |
| 2015/0179724 A1 | 6/2015 | Lee et al. | |
| 2015/0241744 A1* | 8/2015 | Nakata | G02F 1/136204 257/43 |
| 2015/0379924 A1 | 12/2015 | Matsueda et al. | |
| 2016/0013256 A1 | 1/2016 | Gai et al. | |
| 2019/0156744 A1 | 5/2019 | Song et al. | |
| 2020/0098841 A1 | 3/2020 | Song et al. | |
| 2020/0227500 A1* | 7/2020 | Chen | G09G 3/3233 |
| 2023/0021559 A1* | 1/2023 | Guo | H10D 86/423 |
| 2024/0233611 A1* | 7/2024 | Sun | G09G 3/32 |

FOREIGN PATENT DOCUMENTS

| | | |
|---|---|---|
| CN | 103022149 A | 4/2013 |
| CN | 103839973 A | 6/2014 |
| CN | 104164683 A | 11/2014 |
| CN | 104733499 A | 6/2015 |
| CN | 105633103 A | 6/2016 |
| CN | 108538857 A | 9/2018 |
| CN | 109273498 A | 1/2019 |
| CN | 109300841 A | 2/2019 |
| CN | 109427287 A | 3/2019 |
| CN | 109742092 A | 5/2019 |
| CN | 109913930 A | 6/2019 |
| CN | 110085606 A | 8/2019 |
| CN | 212257399 U | 12/2020 |
| CN | 212365969 U | 1/2021 |
| WO | 2017087884 A1 | 5/2017 |

OTHER PUBLICATIONS

First Office Action in the Chinese Patent Application No. 202011023605.4, dated Jan. 5, 2023; English translation attached.

* cited by examiner

BACK PLATE AND ANODE BACK PLATE FOR 3D PRINTING

CROSS-REFERENCE TO RELATED APPLICATION

This application is the U.S. national stage application under 35 U.S.C. § 371 of International Application No. PCT/CN2021/080744, filed on Mar. 15, 2021, which claims priorities of the Chinese patent application No. 202011025488.5, filed on Sep. 25, 2020, the Chinese patent application No. 202011023605.4, filed on Sep. 25, 2020, and the Chinese patent application No. 202011023517.4, filed on Sep. 25, 2020. Each of the forgoing applications is herein incorporated by reference in its entirety for all purposes.

TECHNICAL FIELD

The present disclosure relates to the field of display technology or 3D printing technology, and more particularly to a back plate, an anode back plate for 3D printing.

BACKGROUND

In the related art, when manufacturing a back plate in a display technology field or a three-dimensional (3D) printing technology, when the size of the pixel area occupied by the pixel structure in the back plate is small, the pixel area cannot be saved, and driving transistors in the pixel structure cannot be reasonably laid out by the saved pixel area.

SUMMARY

In a first aspect, an embodiment of the present disclosure provides a back plate, includes a base substrate, gate lines, data lines and power supply lines arranged on the base substrate crossing each other in rows and columns, and pixel structures arranged in an array on the base substrate, wherein each pixel structure includes a driving transistor, a switching transistor connected to the driving transistor, and a pixel electrode connected to the driving transistor; a gate line and a data line are connected to the switching transistor, and a power supply line is connected to the driving transistor; in a same row of pixel structures or a same column of pixel structures, a power supply line is arranged between an (2n−1)th pixel structure and an 2n-th pixel structure, and the power supply line is connected to a source electrode of a driving transistor in the (2n−1)th pixel structure and a source electrode of a driving transistor in the 2n-th pixel structure; n is a positive integer greater than or equal to 1.

In a second aspect, an embodiment of the present disclosure provides an anode back plate for 3D printing, includes a base substrate, gate lines, data lines and power supply lines arranged on the base substrate crossing to each other in rows and columns, and pixel structures arranged in an array on a base substrate; each pixel structure includes a pixel electrode of the anode back plate located on the base substrate, a driving transistor electrically connected to the pixel electrode, and a switching transistor electrically connected to the driving transistor; the pixel electrode is an anode; the gate line extends along a row direction of the array and is located on a side of the pixel structure close to a next row of pixel structures; the data line extends along a column direction of the array, the power supply line includes a power supply line extending along the column direction; the data line and the power supply line extending along the column direction are located on opposite sides of the pixel structure; in a pixel area where the pixel structure is located, the driving transistor and the switching transistor are arranged in sequence along the column direction; a gate electrode of the driving transistor extends in the row direction from the data line to the power supply line, and the gate electrode of the driving transistor extends in the column direction from the gate line of a previous row of pixel structures to the switching transistor; a width direction of a channel in an active layer pattern of the driving transistor is the row direction, and the channel extends in the row direction from the data line located on one side of the pixel structure to the power supply line located on the other side of the pixel structure; a source electrode of the driving transistor and a drain electrode of the driving transistor extend along the row direction, and the source electrode of the driving transistor and the drain electrode of the driving transistor are sequentially arranged along the column direction; a gate electrode of the driving transistor is connected to a drain electrode of the switching transistor, the source electrode of the driving transistor is electrically connected to the power supply line, and the drain electrode of the driving transistor is electrically connected to the pixel electrode; a source electrode of the switching transistor is electrically connected to the data line, and a gate electrode of the switching transistor is electrically connected to the gate line; the drain electrode of the driving transistor is electrically connected to the pixel electrode through a capacitor electrode layer; there is an overlapping area on the base substrate between the capacitor electrode layer and an extension portion of the gate electrode of the driving transistor, and the capacitor electrode layer at least forms a capacitor with the extension portion of the gate electrode of the driving transistor; the anode back plate for 3D printing further includes a conductive layer including a metal arranged between the drain electrode of the driving transistor and the capacitor electrode layer; an orthographic projection of the conductive layer on the base substrate covers an orthographic projection of the active layer pattern on the base substrate.

DETAILED DESCRIPTION

The technical solutions in the embodiments of the present disclosure will be clearly and completely described below with reference to the accompanying drawings in the embodiments of the present disclosure. Obviously, the described embodiments are only a portion of the embodiments of the present disclosure, but not all of the embodiments. Based on the embodiments in the present disclosure, all other embodiments obtained by those of ordinary skill in the art without creative efforts shall fall within the protection scope of the present disclosure.

The back plate provided by the present disclosure can at least be used for a printing back plate in a 3D printing system, the back plate includes printing anodes, which are arranged in an array, and the back plate drives the anodes to realize 3D printing. Alternatively, the back plate provided by the present disclosure can at least be used in the display field to drive pixel electrodes to realize liquid crystal display or OLED display.

Figure 1A:
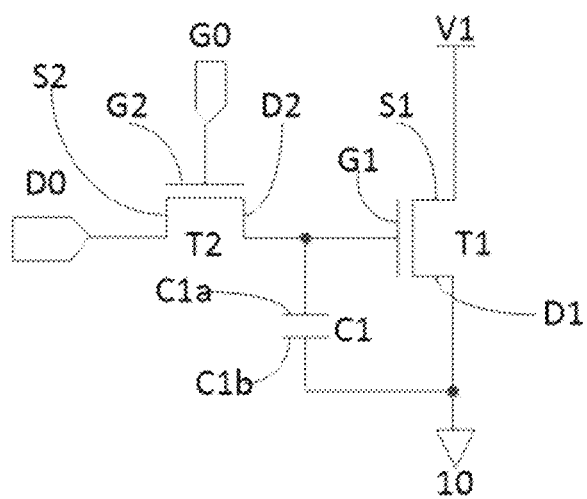
FIG. 1a is a circuit diagram of an embodiment of a pixel structure in a back plate according to at least one embodiment of the present disclosure.
Figure 1B:
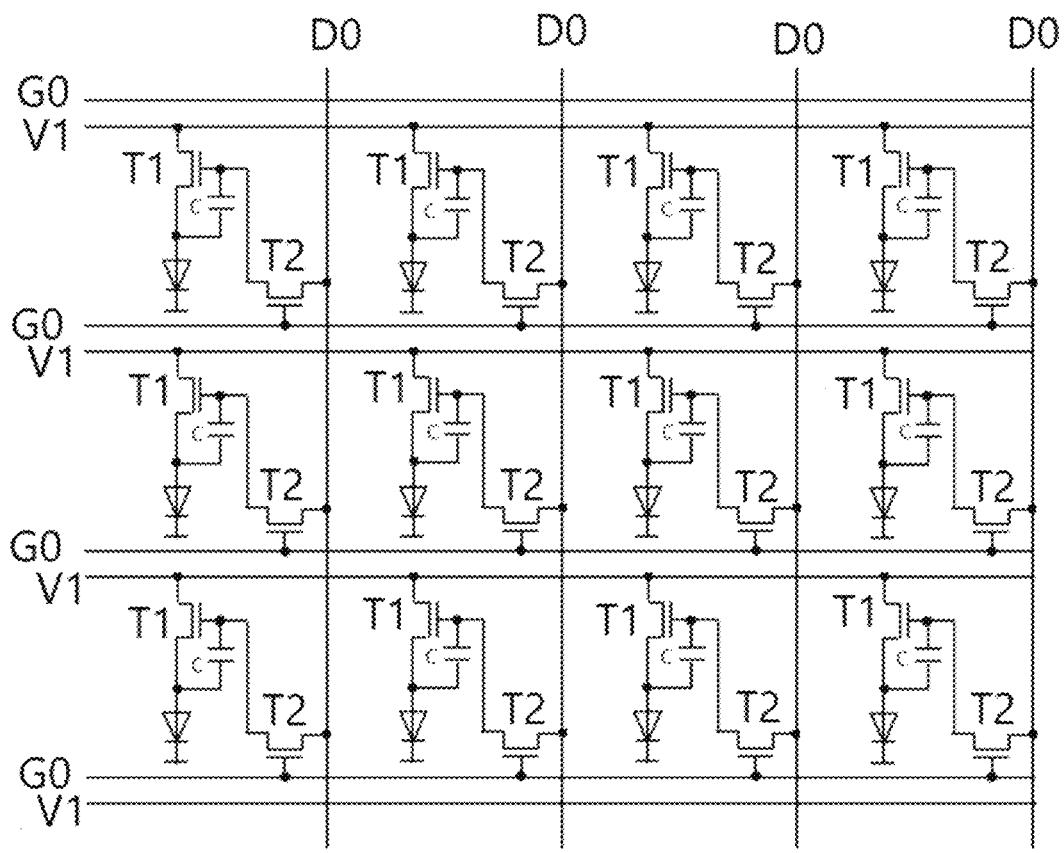
FIG. 1B is a circuit diagram of a plurality of pixel structures in the back plate according to at least one embodiment of the present disclosure.

The back plate described in at least one embodiment of the present disclosure may include a pixel structure arranged on a base substrate; FIG. 1a shows an equivalent circuit diagram of a pixel structure, and FIG. 1B shows an equivalent circuit diagram of a plurality of pixel structures arranged in an array.

The equivalent circuit diagram of the pixel structure shown in FIG. 1a includes a driving transistor T1, a switching transistor T2, a storage capacitor C1 and a pixel electrode 10;

A gate electrode G1 of the driving transistor T1 is electrically connected to a first electrode plate C1a of the storage capacitor C1, a source electrode S1 of the driving transistor T1 is electrically connected to a power supply line V1, and a drain electrode D1 of the driving transistor T1 is electrically connected to the pixel electrode 10;

A gate electrode G2 of the switching transistor T2 is electrically connected to a gate line G0, a source electrode S2 of the switching transistor T2 is electrically connected to a data line DO, and a drain electrode D2 of the switching transistor T2 is electrically connected to the first electrode plate C1a of the storage capacitor C1;

A second electrode plate C1b of the storage capacitor C1 is electrically connected to the pixel electrode 10.

During operation of the pixel structure shown in FIG. 1a, under the control of the gate driving signal provided by the gate line G0, T2 is turned on, so as to provide a data voltage on the data line DO to the gate electrode of T1, under the control of the potential of the gate electrode of T1, T1 controls the connection or disconnection between the power supply line V1 and the pixel electrode 10; C1 is used to maintain the potential of the gate electrode of T1.

In FIG. 1B, T2 is a switching transistor, T1 is a driving transistor, G0 is a gate line, V1 is a power supply line, DO is a data line, and C is a storage capacitor.

The back plate according to at least one embodiment of the present disclosure includes a base substrate, gate lines, data lines and power supply lines arranged on the base substrate crossing each other in rows and columns, and pixel structures arranged in an array on the base substrate;

The pixel structure includes a driving transistor, a switching transistor connected to the driving transistor, and a pixel electrode connected to the driving transistor; the gate line and the data line are respectively connected to the switching transistor, and the power supply line is connected to the driving transistor;

In the same row of pixel structures or the same column of pixel structures, a power supply line is arranged between the (2n−1)th pixel structure and the 2n-th pixel structure, and the power supply line is connected to the source electrode of the driving transistor in the (2n−1)th pixel structure and the source electrode of the driving transistor in the 2n-th pixel structure; n is a positive integer greater than or equal to 1.

In a specific implementation, the (2n−1)th pixel structure and the 2n-th pixel structure share one power supply line, which can save the pixel area, and can reasonably lay out the driving transistors in the pixel structure through the saved pixel area.

In specific implementation, in the same row of pixel structures, the (2n−1)th pixel structure may be the pixel structure located in the (2n−1)th column of the same row of pixel structures, and the 2n-th pixel structure may be the pixel structure located in the 2n-th column of the same row of pixel structures, but not limited to this;

In the same column of pixel structures, the (2n−1)th pixel structure may be the pixel structure located in the (2n−1)th row of the same column of pixel structures, and the 2n-th pixel structure may be the pixel structure located in the 2n-th row of the same column of pixel structures, but this is not limited.

Optionally, the (2n−1)th pixel structure and the 2n-th pixel structure are two adjacent pixel structures located in the same row or in the same column; the driving transistor in the (2n−1)th pixel structure is a first driving transistor, and the driving transistor in the 2n-th pixel structure is a second driving transistor;

The power supply line and the source electrode of the first driving transistor are located on different layers, the power supply line and the source electrode of the second driving transistor are located on different layers, and the power supply line is connected to the source electrode of the first driving transistor and the source electrode of the second driving transistor through a via hole.

In a specific implementation, the driving transistor in the first pixel structure in two adjacent pixel structures is the first driving transistor, and the driving transistor in the second pixel structure in the two adjacent pixel structures is the second driving transistor, the power supply line is electrically connected to the source electrodes of the two driving transistors.

Optionally, the source electrode of the first driving transistor and the source electrode of the second driving transistor are located on the same layer, the source electrode of the first driving transistor is connected to the source electrode of the second driving transistor, and a position where the power supply line and the source electrode are connected through the via hole is a position where the source electrode of the first driving transistor and the source electrode of the second driving transistor are connected.

In actual operation, the source electrode of the first driving transistor and the source electrode of the second driving transistor may both be located in the source-drain metal layer, and the power supply line is electrically connected to the first conductive connection portion; the source electrode of the first driving transistor and the source electrode of the second driving transistor are electrically connected through a second conductive connection portion, the first conductive connection portion and the second conductive connection portion are connected through a via hole, and an orthographic projection of the first conductive connection portion on the base substrate at least partially overlaps an orthographic projection of the second conductive connection portion on the base substrate.

In at least one embodiment of the present disclosure, the gate lines extend along a row direction of the array, and the data lines and the power supply lines extend along a column direction of the array; two data lines respectively connected to the switching transistors in the 2n-th pixel structure and the (2n+1)th pixel structure are arranged between the 2n-th pixel structure and the (2n+1)th pixel structure, two data lines respectively connected to the switching transistors in the (2n−1)th pixel structure and the (2n−2)th pixel structure are arranged between the (2n−1)th pixel structure and the (2n−2)th pixel structure.

Figure 2:
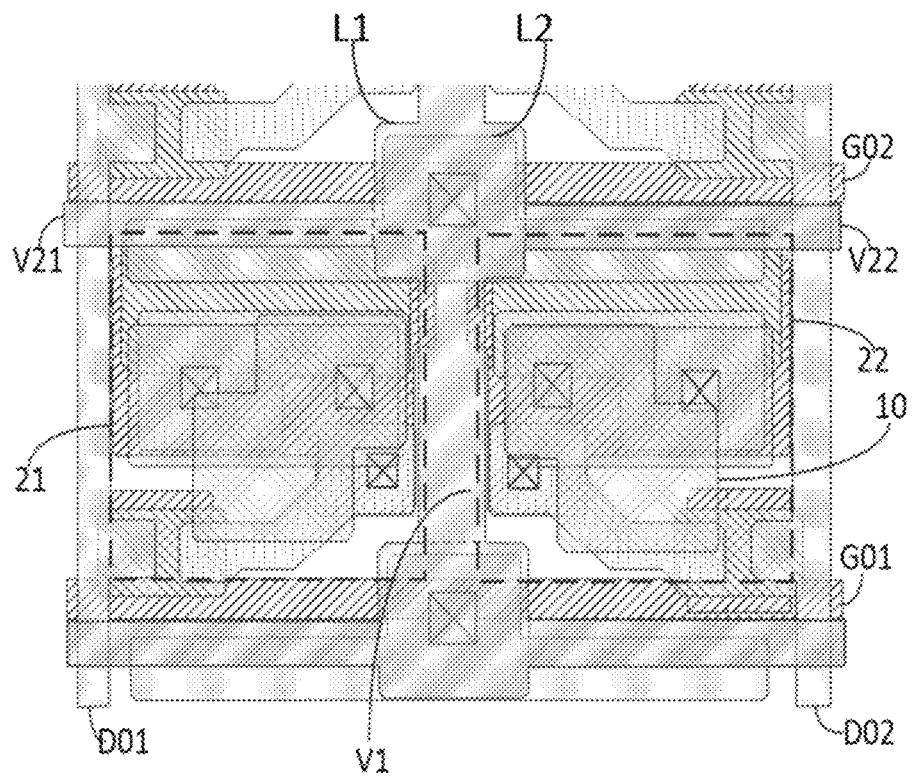
FIG. 2 is a schematic diagram of a layout of a back plate according to at least one embodiment of the present disclosure.
Figure 3:
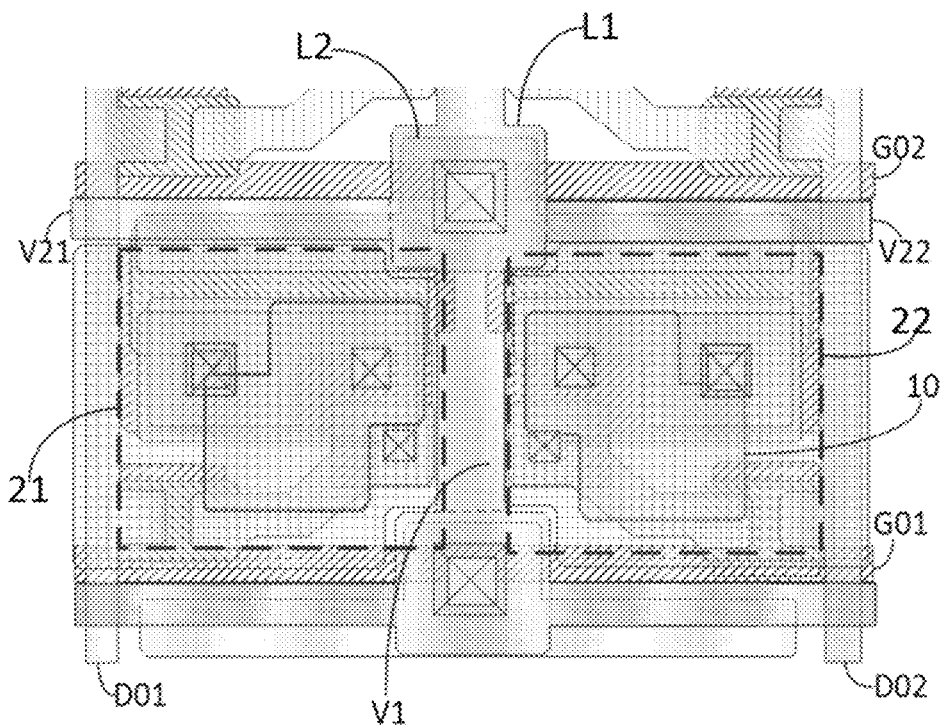
FIG. 3 is a schematic diagram of another layout of the back plate according to at least one embodiment of the present disclosure.

In at least one embodiment of the substrate shown in FIG. 2 and FIG. 3, the first pixel structure 21 and the second pixel structure 22 are respectively the (2n−1)th pixel structure and the 2n-th pixel structure, the power supply line is arranged therebetween, further, the power supply line is shared the two pixel structures. The switching transistor in the first pixel structure 21 is connected to the first data line D01, and the switching transistor in the second pixel structure 22 is connected to the second data line D02. The two pixel structures, the power supply lines, and the data lines D01 and D02 together form a repeating unit that is sequentially and repeatedly arranged in the row or column direction.

In one case, the repeating unit including the (2n−1)th pixel structure and the 2n-th pixel structure located in the same row may be repeated continuously along the row direction, the (2n−1)th pixel structure and the 2n-th pixel structure are symmetrically arranged with one power supply lines between them;

In another case, the repeating unit including the (2n−1)th pixel structure and the 2n-th pixel structure located in the same column may be repeated continuously along the column direction, the (2n−1)th pixel structure and the 2n-th pixel structure are arranged symmetrically with respect to one power supply line between them.

One embodiment is that, in the pixel area where the pixel structure is located, the driving transistor and the switching transistor are arranged in sequence along the row or column direction, and the following is an example of the arrangement in the column direction;

The gate electrode of the driving transistor extends from the data line to the power supply line in the row direction, and the gate electrode of the driving transistor extends from the gate line of the pixel structure in the previous row to the switching transistor in the column direction;

The width direction of the channel in the active layer pattern of the driving transistor is consistent with the row direction, and the channel extends from the data line arranged on one side of the pixel structure to the power supply line arranged on the other side of the pixel structure in the row direction.

The source electrode of the driving transistor and the drain electrode of the driving transistor respectively extend along the row direction, and the source electrode of the driving transistor and the drain electrode of the driving transistor are sequentially arranged along the column direction;

The gate electrode of the driving transistor is connected to the drain electrode of the switching transistor, the source electrode of the driving transistor is electrically connected to the power supply line, and the drain electrode of the driving transistor is electrically connected to the pixel electrode;

The source electrode of the switching transistor is electrically connected to the data line, and the gate electrode of the switching transistor is electrically connected to the gate line.

In the back plate according to at least one embodiment of the present disclosure, in the pixel area where the pixel structure is located, the driving transistor and the switching transistor are arranged in sequence along the column direction, and the gate electrodes of the driving transistors extend from the data line arranged on one side of the pixel structure to the power supply line arranged on the other side of the pixel structure in the row direction, to occupy most of the pixel area in the row direction, and the gate electrode of the driving transistor extends from the gate line of the pixel structure in the previous row to the switching transistor in the column direction, so that the gate electrode of the driving transistor occupies most of the pixel area in the column direction, and the driving transistor and the switching transistor are arranged in compact, and the channel in the active layer pattern of the driving transistor extends from the data line arranged on one side of the pixel structure to the power supply line arranged on the other side of the pixel structure in the row direction, so as to increase the aspect ratio of the driving transistor, and improve the driving capability of the driving transistor.

In at least one embodiment of the present disclosure, the source electrode of the driving transistor and the drain electrode of the driving transistor may be arranged on a source-drain metal layer, and the source-drain metal layer may be arranged between the active layer of the driving transistor and the base substrates, or the source-drain metal layer may be arranged on a side of the active layer away from the base substrate.

In a specific implementation, the data lines and the power supply lines extending in the column direction are located on opposite sides of the pixel structure, the data lines may be located on the first side of the pixel structure, and the power supply lines extending in the column direction are located on the second side of the pixel structure, and the first side and the second side are opposite sides.

In at least one embodiment of the present disclosure, the gate electrode of the driving transistor extending from the data line to the power supply line in the row direction refers to: in the row direction, the extension direction of the gate electrode of the driving transistor is from the data line to the power supply line, wherein the data line may be located on the first side of the pixel structure where the driving transistor is located, and the power supply line may be located on the second side of the pixel structure where the driving transistor is located and extended along the column direction, but not limited to this.

In at least one embodiment of the present disclosure, the gate electrode of the driving transistor extending from the gate line of the pixel structure in the previous row to the switching transistor in the column direction refers to: in the column direction, the extension direction of the gate electrode of the driving transistor is from the gate line of the pixel structure in the previous row to the switching transistor;

In at least one embodiment of the present disclosure, the channel extending from the data line arranged on one side of the pixel structure to the power supply line arranged on the other side of the pixel structure in the row direction refers to: in the row direction, the extending direction of the channel is from the data line arranged on one side of the pixel structure to the power supply line arranged on the other side of the pixel structure.

In a specific implementation, the gate line has a first protruding portion, the data line has a second protruding portion, the gate electrode of the switching transistor is the first protruding portion, and the source electrode of the switching transistor is the second protruding portion;

The width direction of the channel of the active layer pattern of the switching transistor is perpendicular to the width direction of the channel of the driving transistor;

The drain electrode of the switching transistor further includes an extension portion connected to the drain electrode, the extension portion extends from the switching transistor to the power supply line, and the drain electrode of the switching transistor is connected to the gate electrode of the driving transistor through the extension portion.

In actual operation, the gate electrode of the switching transistor is the first protruding portion of the gate line, the source electrode of the switching transistor is the second protruding portion of the data line, and the drain electrode of the switching transistor is connected to the gate electrode of the driving transistor through the extension portion. The extension portion extends toward the power supply line, so that the layout of the switching transistor and the driving transistor is compact.

In a preferred case, the positions of the driving transistors in the (2n−1)th pixel structure and the driving transistors in the 2n-th pixel structure in the pixel area are symmetrical with respect to the power supply line between the (2n−1)th pixel structure and the 2n-th pixel structure; the use of a symmetrical pixel structure can save the pixel area and improve the aspect ratio of the driving transistor;

The positions of the switching transistor in the (2n−1)th pixel structure and the switching transistor in the 2n-th pixel structure in the pixel area are symmetrical with respect to the power supply line between the (2n−1)th pixel structure and the 2n-th pixel structure.

Figure 4:
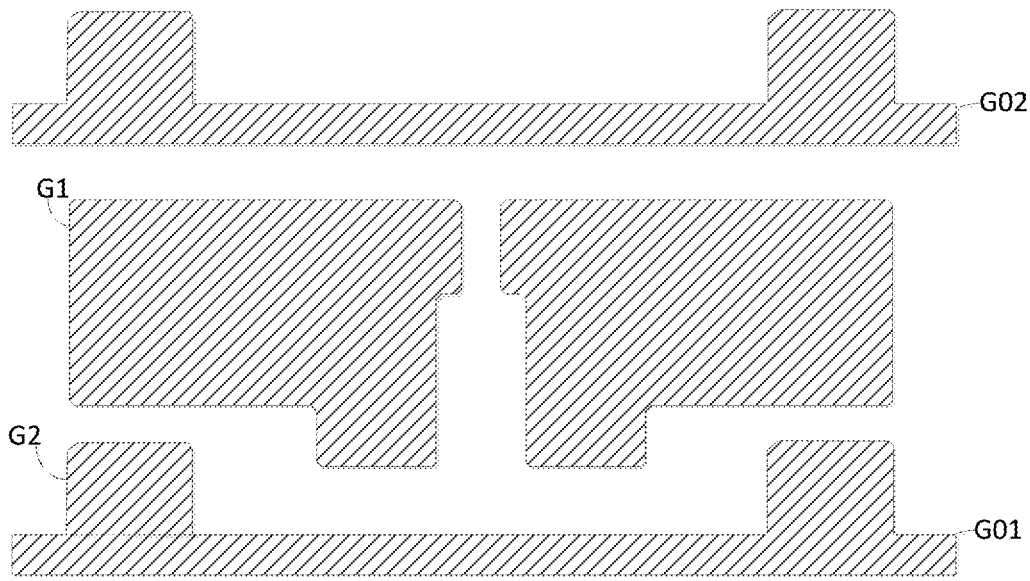
FIGS. 4 and 5 are top views of the gate metal layer in FIG. 2.
Figure 6:
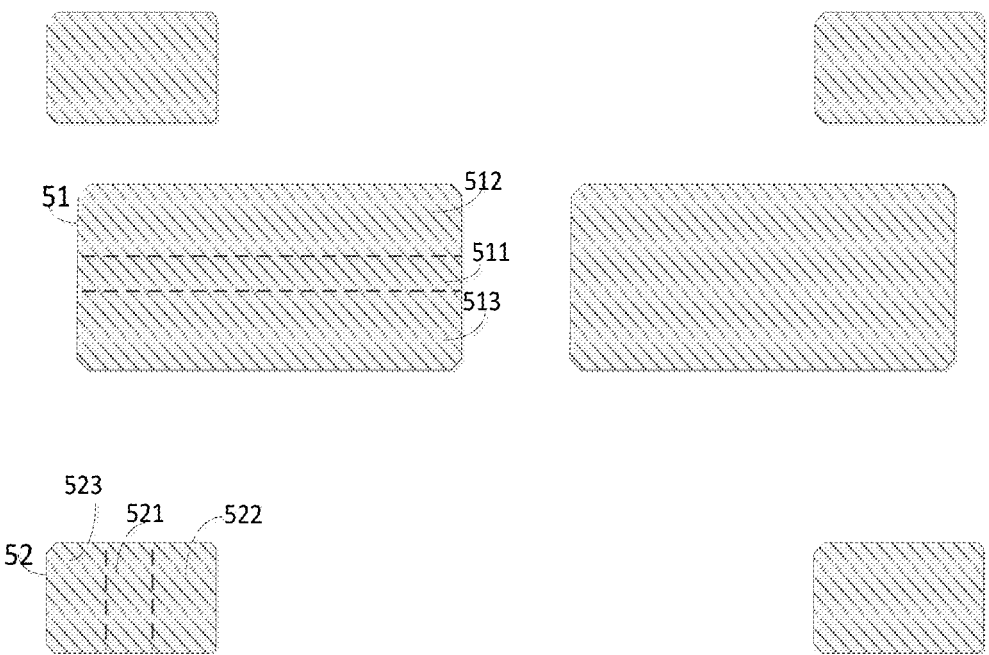
FIG. 6 is a top view of an active layer in FIG. 2.
Figure 7:
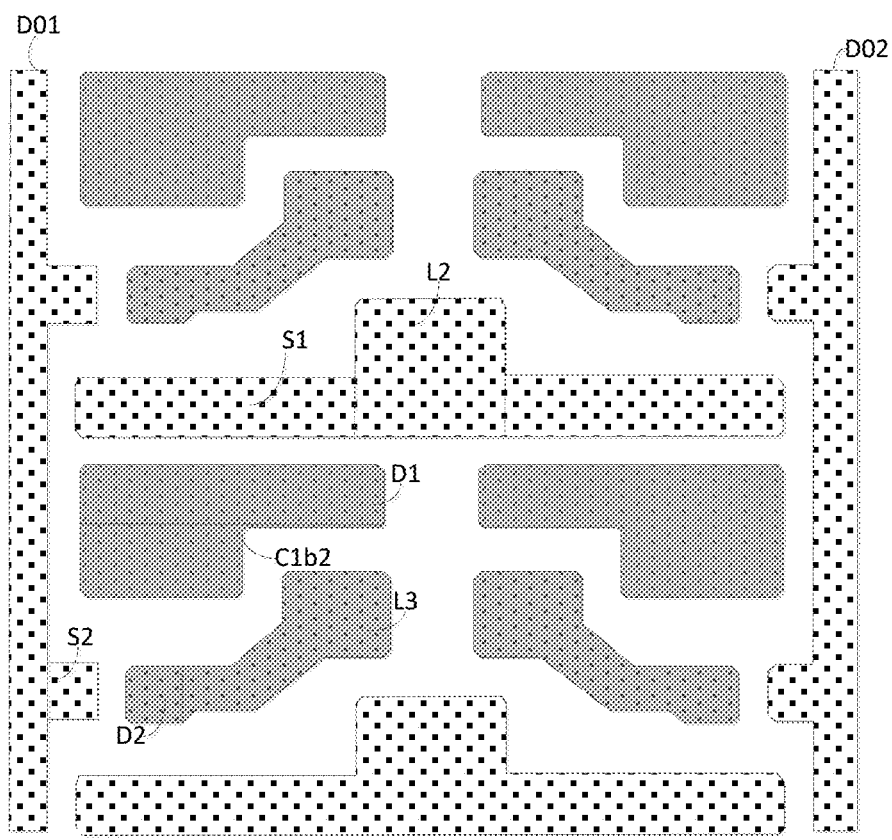
FIG. 7 is a top view of a source-drain metal layer in FIG. 2.

As shown in FIG. 2, the back plate according to at least one embodiment of the present disclosure includes a base substrate, gate lines, data lines and power supply lines arranged on the base substrate crossing each other in rows and columns, and pixel structures arranged in an array on the base substrate;

In FIG. 2, the first gate line is labeled G01, the first data line is labeled D01, the second gate line is labeled G02, the second data line is labeled D02, and the power supply line extending in the column direction is labeled V1;

The left pixel structure (the left pixel structure is the first pixel structure 21 on the left in FIG. 2) includes a driving transistor, a switching transistor connected to the driving transistor, and a pixel electrode connected to the driving transistor;

The first gate line G01 extends along the row direction of the array and is located on the side of the pixel structure close to the next row of pixel structures; the first data line D01 and the power supply line V1 extending along the column direction are located on two opposite side of the first pixel structure 21; D01 is located on the left side of the first pixel structure 21, and V1 is located on the right side of the first pixel structure 21;

In the pixel area where the first pixel structure 21 is located, the driving transistor and the switching transistor are arranged in sequence along the column direction;

As shown in FIG. 2 and FIG. 4, the gate electrode G1 of the driving transistor in the first pixel structure 21 extends from the first data line D01 to the power supply line V1 in the row direction, and the gate electrode of the driving transistor extends from a gate line connected to the pixel structure of the previous row (in FIG. 2, the gate line connected to the pixel structure of the previous row is the second gate line G02) to the switching transistor in the column direction;

As shown in FIG. 2 and FIG. 6, the width direction of the channel 511 in the active layer pattern of the driving transistor is the row direction, and the channel 511 extends from the first data line D01 to the power supply line V1 in the row direction;

As shown in FIG. 2 and FIG. 7, the source electrode S1 of the driving transistor and the drain electrode D1 of the driving transistor respectively extend in the row direction, and the source electrode S1 of the driving transistor and the drain electrode D1 of the driving transistor are arranged in sequence along the column direction; the source electrode S1 of the driving transistor and the drain electrode D1 of the driving transistor are both located in the source-drain metal layer, and the source-drain metal layer is arranged on a side of the active layer away from the base substrate.

As shown in FIG. 2 and FIG. 4, the first gate line G01 has a first protruding portion, the main body of the first gate line G01 extends in the row direction, the first protruding portion protrudes from the main body of G01, and the gate electrode G2 of the switching transistor is the first protruding portion;

As shown in FIG. 2 and FIG. 7, the first data line D01 has a second protruding portion, the main body of the first data line D01 extends in the column direction, the second protruding portion protrudes from the main body of D01, the source electrode S2 of the switching transistor is the second protruding portion;

As shown in FIG. 2, FIG. 4 and FIG. 7, the gate electrode G2 of the switching transistor is the first protruding portion, and the source electrode S2 of the switching transistor is the second protruding portion, so that the switching transistor occupies a small space.

In a preferred case, pixel structures of two adjacent columns in the same row of pixel structures are arranged in a mirror image, and a symmetrical pixel structure is adopted to save the pixel area and improve the aspect ratio of the driving transistor.

As shown in FIG. 2, the first pixel structure 21 and the second pixel structure 22 are arranged on both sides of the power supply line V1 in mirror image; the first pixel structure 21 and the second pixel structure 22 share the power supply line V1; the power supply line is located between the driving transistor included in the first pixel structure 21 and the driving transistor included in the second pixel structure 22; the first pixel structure 21 includes a first data line D01, and the second pixel structure 22 includes a second data line D02, the first data line D01 is located on the side of the first pixel structure 21 away from the power supply line V1, and the second data line D02 is located on the side of the second pixel structure 22 away from the power supply line V1.

As shown in FIG. 2 and FIG. 7, the source electrode S1 of the driving transistor in the first pixel structure 21 is connected to the source electrode of the driving transistor in the second pixel structure 22.

Optionally, the length of the gate electrode of the driving transistor in the column direction is greater than the length of the active layer pattern of the driving transistor in the column direction, so that the gate electrode of the driving transistor extends towards the switching transistor relative to the active layer. There is no overlapping area between the extension portion of the gate electrode of the driving transistor and the projection of the active layer pattern of the driving transistor on the substrate; the drain electrode of the driving transistor is electrically connected to the pixel electrode through the capacitor electrode layer; an overlapping area is formed between the capacitor electrode layer and the extension portion of the gate electrode on the base substrate, and the capacitor electrode layer at least forms a capacitor with the extension portion of the gate electrode.

In a specific implementation, the capacitor electrode layer not only serves as a connection layer, but also serves as an electrode of a storage capacitor.

As shown in FIG. 2, FIG. 4, FIG. 5, FIG. 6 and FIG. 10, the length of the gate electrode G1 of the driving transistor in the column direction is greater than the length of the active layer pattern 51 of the driving transistor in the column direction, so that the gate electrode G1 of the driving transistor extends towards the switching transistor relative to the active layer, and there is no overlapping area between the extended portion 40 of the gate electrode G1 and the projection of the active layer pattern 51 of the driving transistor on the substrate; the drain electrode D1 of the driving transistor is electrically connected to the pixel electrode 10 through a capacitor electrode layer;

As shown in FIG. 2, FIG. 4, FIG. 5 and FIG. 10, there is an overlapping area between the capacitor electrode layer and the extension portion 40 of the gate electrode G1 on the base substrate, and the capacitor electrode layer at least forms a capacitor with the extended portion 40 of the gate electrode.

Optionally, the capacitor electrode layer is located between the drain electrode of the driving transistor and the pixel electrode, a first insulating layer is provided between the capacitor electrode layer and the drain electrode of the driving transistor, and a second insulating layer is arranged between the capacitor electrode layer and the pixel electrode;

The capacitor electrode layer is electrically connected to the drain electrode of the driving transistor through a via hole provided in the first insulating layer, and the capacitor electrode layer is electrically connected to the pixel electrode through a via hole of the second insulating layer;

Wherein, there is an overlapping area between the orthographic projection of the capacitor electrode layer on the base substrate and the orthographic projection of the gate electrode of the driving transistor on the base substrate, so as to form a capacitor.

Optionally, the drain electrode of the driving transistor is located in the source-drain metal layer, the pixel electrode is located in the pixel electrode layer, the capacitor electrode layer A9 is located between the source-drain metal layer A4 and the pixel electrode layer A11, a first insulating layer A5 is arranged between the capacitor electrode layer A9 and the source-drain metal layer A4, a second insulating layer A10 is arranged between the capacitor electrode layer A9 and the pixel electrode layer A11, and the capacitor electrode layer A9 is electrically connected to the drain electrode of the driving transistor through a via hole, the capacitor electrode layer A9 is electrically connected to the pixel electrode through a via hole, and there is an overlapping area between the orthographic projection of the capacitor electrode layer A9 on the base substrate and the orthographic projection of the gate electrode of the driving transistor on the base substrate, so as to form a capacitor.

In at least one embodiment of the present disclosure, the power supply line and the capacitor electrode layer are arranged at the same layer and made of the same material, so that there is enough space in the source-drain metal layer to set the source electrode of the driving transistor and the drain electrode of the driving transistor, the aspect ratio of the driving transistor can be set to be larger, so as to improve the driving capability of the driving transistor.

In at least one embodiment of the present disclosure, the back plate further includes the first insulating layer, an organic resin layer, a conductive layer, and a third insulating layer, that are sequentially arranged between the drain electrode of the driving transistor and the capacitor electrode layer.

An orthographic projection of the organic resin layer on the base substrate covers an orthographic projection of the active layer pattern on the base substrate, and the orthographic projection of the conductive layer on the base substrate covers the orthographic projection of the active layer pattern on the base substrate; the organic resin layer and the conductive layer prevent the active layer pattern from being damaged;

The drain electrode of the driving transistor is electrically connected to the conductive layer through a via hole penetrating the first insulating layer and the organic resin layer, and the conductive layer is electrically connected to the conductive layer through a via hole penetrating the third insulating layer.

In actual operation, the organic resin layer can be used to improve the ability to block hydrogen and improve the stability of the back plate; the conductive layer covers the organic resin layer, which can improve the ability to block hydrogen and prevent the lamination of the capacitor electrode layer from affecting the organic resin layer.

Optionally, the conductive layer may be made of indium tin oxide (ITO), and the organic resin layer may be made of an organic insulating material, but not limited thereto.

Figure 14:
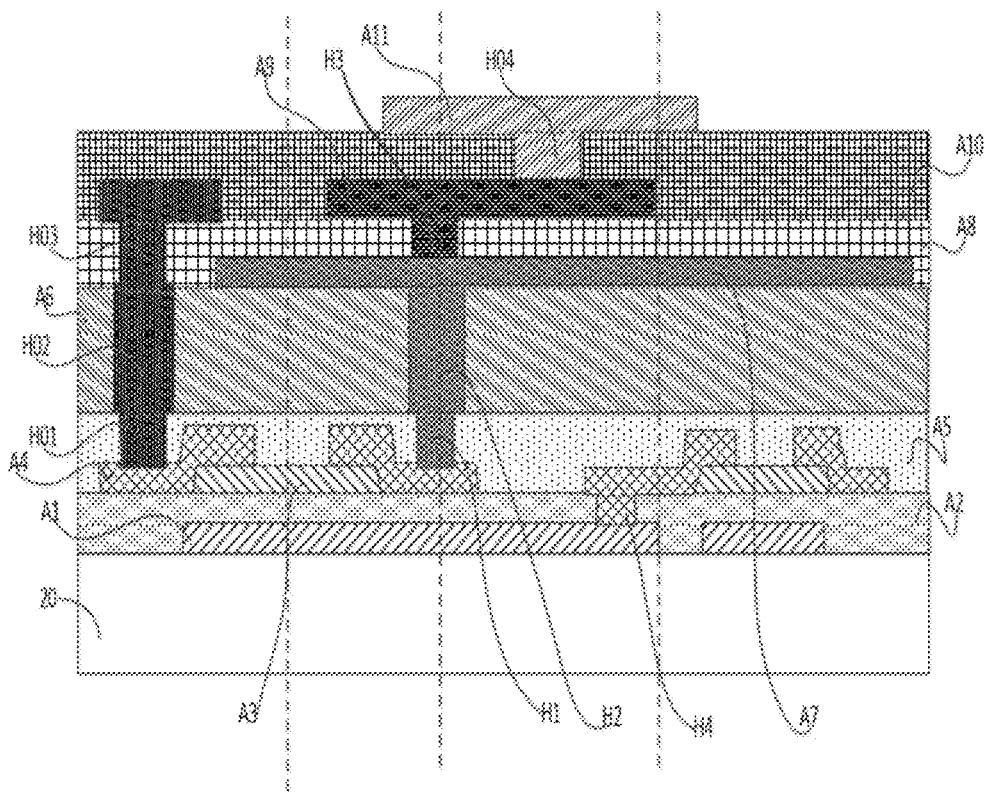
FIG. 14 is a cross-sectional view of the back plate shown in FIG. 13 along the direction A-A'.

As shown in FIG. 3 and FIG. 14, the drain electrode D1 of the driving transistor is located in the source-drain metal layer A4, and the back plate according to at least one embodiment of the present disclosure further includes the first insulating layer A5, the organic resin layer A6, the conductive layer A7 and the third insulating layer A8 arranged between the source-drain metal layer A4 and the capacitor electrode layers A9;

The organic resin layer A6 and the conductive layer A7 are used to block hydrogen; the orthographic projection of the organic resin layer A6 on the base substrate covers the orthographic projection of the active layer pattern on the base substrate, the orthographic projection of the conductive layer A7 on the base substrate covers the orthographic projection of the active layer pattern on the base substrate;

The drain electrode of the driving transistor is electrically connected to the conductive layer A7 through a via hole penetrating the first insulating layer A5 and the organic resin layer A6, and the conductive layer A7 is electrically connected to the capacitor electrode layer A9 through a via hole penetrating the third insulating layer A8.

In specific implementation, the gate electrode of the driving transistor, the gate electrode of the switching transistor and the gate line may be arranged on the same layer on the base substrate, and made of the same material; the active layer pattern of the driving transistor and the active layer pattern of the switching transistor can be arranged above a film layer where the gate electrode is located; the source electrode of the driving transistor, the drain electrode of the driving transistor, the source electrode of the switching transistor and the drain electrode of the switching transistor are all arranged on the same layer and made of the same material, the power supply line and the capacitor electrode layer are arranged at the same layer and made of the same material, the power supply line is located above the source electrode of the driving transistor, and is connected to the source electrode of the driving transistor through a via hole, and the pixel electrode is arranged above the power supply line and the capacitor electrode layer;

The drain electrode of the driving transistor is electrically connected to the pixel electrode through the capacitor electrode layer, and there is an overlapping area between the orthographic projection of the capacitor electrode layer on the base substrate and the orthographic projection of the extension portion of the gate electrode of the driving transistor relative to the active layer on the base substrate, so as to form a capacitor;

The drain electrode of the switching transistor is electrically connected to the gate electrode of the driving transistor through an extension extending in the direction of the power supply line.

In at least one embodiment of the present disclosure, as shown in FIG. 2, FIG. 3, FIG. 4 and FIG. 14, the gate electrode G1 of the driving transistor, the gate electrode G2 of the switching transistor, the first gate line G01 and the second gate line G02 can be arranged on the gate metal layer A1; as shown in FIG. 2, FIG. 3, FIG. 6 and FIG. 14, the active layer pattern 51 of the driving transistor and the active layer pattern of the switching transistor are arranged on the active layer A3; as shown in FIG. 2, FIG. 3, FIG. 7 and FIG. 14, the source electrode S1 of the driving transistor, the drain electrode D1 of the driving transistor, the source electrode S2 of the switching transistor and the drain electrode D2 of the switching transistor are all arranged on the source-drain metal layer A4; as shown in FIG. 2, FIG. 3, FIG. 10 and FIG. 14, the power supply line V1 and the capacitor electrode layer A9 are arranged at the same layer and made of the same material; As shown in FIG. 2, FIG. 3, FIG. 11 and FIG. 14, the pixel electrode is located in the pixel electrode layer A11;

The gate metal layer A1, the active layer A3, the source-drain metal layer A4, the capacitor electrode layer A9 and the pixel electrode layer A11 may be arranged in sequence on the base substrate.

The drain electrode of the driving transistor located in the source-drain metal layer A4 is electrically connected to the pixel electrode located in the pixel electrode layer A11 through the capacitor electrode layer A9, as shown in FIG. 2, FIG. 4, FIG. 5 and FIG. 10, there is an overlapping area between the orthographic projection of the capacitor electrode layer on the base substrate and the orthographic projection of the gate electrode G1 of the driving transistor relative to the extension portion 40 of the active layer on the base substrate, so as to form a capacitor.

In a specific implementation, two adjacent columns of pixel structures in the same row are symmetrically arranged on both sides of the power supply line;

Two pixel structures symmetrically arranged on both sides of the power supply line share one power supply line, and the power supply line is located between the two driving transistors symmetrically arranged; the source electrodes of the two driving transistors arranged symmetrically extend from one pixel structure to another pixel structure along the row direction, and the source electrodes of the two driving transistors are an integral structure;

The power supply line further includes a first conductive connection portion, and the source electrode of the first driving transistor of the two driving transistors arranged symmetrically and the source electrode of the second driving transistor of the two driving transistors are electrically connected through the second conductive connection portion;

The orthographic projection of the first conductive connection portion on the base substrate at least partially overlaps the orthographic projection of the second conductive connection portion on the base substrate, and the first conductive connection portion is connected to the second conductive connection portion through a via hole, so that the source electrode of the driving transistor is electrically connected to the power supply line.

As shown in FIG. 2 and FIG. 3, the first pixel structure 21 and the second pixel structure 22 are symmetrically arranged on both sides of the power supply line V1;

The first pixel structure 21 and the second pixel structure 22 share one power supply line V1, and the power supply line V1 is located between the driving transistor of the first pixel structure 21 and the driving transistor of the second pixel structure 22; the source electrode S1 of the driving transistor of the first pixel structure 21 extends from the first pixel structure 21 to the second pixel structure 22 along the row direction, and the power supply line V1, the driving transistor of the first pixel structure 21 and the driving transistor of the second pixel structure 22 are an integral structure;

As shown in FIG. 7, the source electrode S1 of the driving transistor of the first pixel structure 21 and the source electrode of the driving transistor of the second pixel structure 22 are electrically connected through a second conductive connection portion L2;

The power supply line further includes a first conductive connection portion L1, the orthographic projection of the first conductive connection portion L1 on the base substrate at least partially overlaps the orthographic projection of the second conductive connection portion L2 on the base substrate, the first conductive connection portion L1 is electrically connected to the second conductive connection portion L2 through a via hole, so that the source electrode S1 of the driving transistor is electrically connected to the power supply line V1.

In at least one embodiment of the present disclosure, the back plate may further include: an isolation layer arranged above the active layer pattern of the driving transistor, the isolation layer is used to isolate impurities from affecting the active layer pattern of the driving transistor; the isolation layer is a single-layer isolation layer or a multi-layer isolation layer, and the single-layer isolation layer or the multi-layer isolation layer includes at least one of an organic resin layer, a metal layer or a metal oxide active layer.

In a specific implementation, an isolation layer is arranged above the active layer of the driving transistor, and the isolation layer can be used to isolate the influence of impurities (such as hydrogen, oxygen, etc.) on the active layer pattern of the driving transistor.

Optionally, the isolation layer may be a single-layer isolation layer, or, the isolation layer may also be at least one of a multi-layer isolation layer, and the isolation layer may include an organic resin layer, a metal layer, or a metal oxide active layer. Optionally, the multi-layer isolation layer is a double-layer isolation layer, and the double-layer isolation layer includes an organic resin layer and a metal oxide active layer sequentially arranged above the active layer.

In a specific implementation, the metal oxide active layer or metal layer in the isolation layer includes an isolation portion arranged above the active layer pattern of the driving transistor of each pixel structure; the isolation portions are independent of each other, or all isolation portions are integrally arranged.

When the isolation layer adopts a metal oxide active layer or a metal layer, the isolation layer includes an isolation portion, and the isolation portion is arranged above the active layer pattern of the driving transistor, and the isolation layer includes a plurality of isolation portions independent of each other, or may be integrally arranged, and the structure of the isolation portions is not limited.

In at least one embodiment of the present disclosure, the back plate may further include the first insulating layer, an organic resin layer, and a conductive layer including a metal and a third insulating layer sequentially arranged between the drain electrode of the driving transistor and the capacitor electrode layer; a second insulating layer is arranged between the capacitor electrode layer and the pixel electrode;

The organic resin layer and the conductive layer are used as protective layers of the active layer pattern of the driving transistor to block hydrogen; the orthographic projection of the organic resin layer on the base substrate covers the orthographic projection of the active layer pattern of the driving transistor on the base substrate, the orthographic projection of the conductive layer on the base substrate covers the orthographic projection of the active layer pattern of the driving transistor on the base substrate;

The via holes between the first conductive connection portion and the second conductive connection portion includes a first via hole, a second via hole and a third via hole; the first via hole penetrates through the first insulating layer. The second via hole penetrates through the organic resin layer, and the third via hole penetrates through the third insulating layer;

The orthographic projection of the first via hole on the base substrate, the orthographic projection of the second via hole on the base substrate, and the orthographic projection of the third via hole on the base substrate at least partially overlap, so that the first conductive connection portion and the second conductive connection portion are electrically connected.

Figure 12:
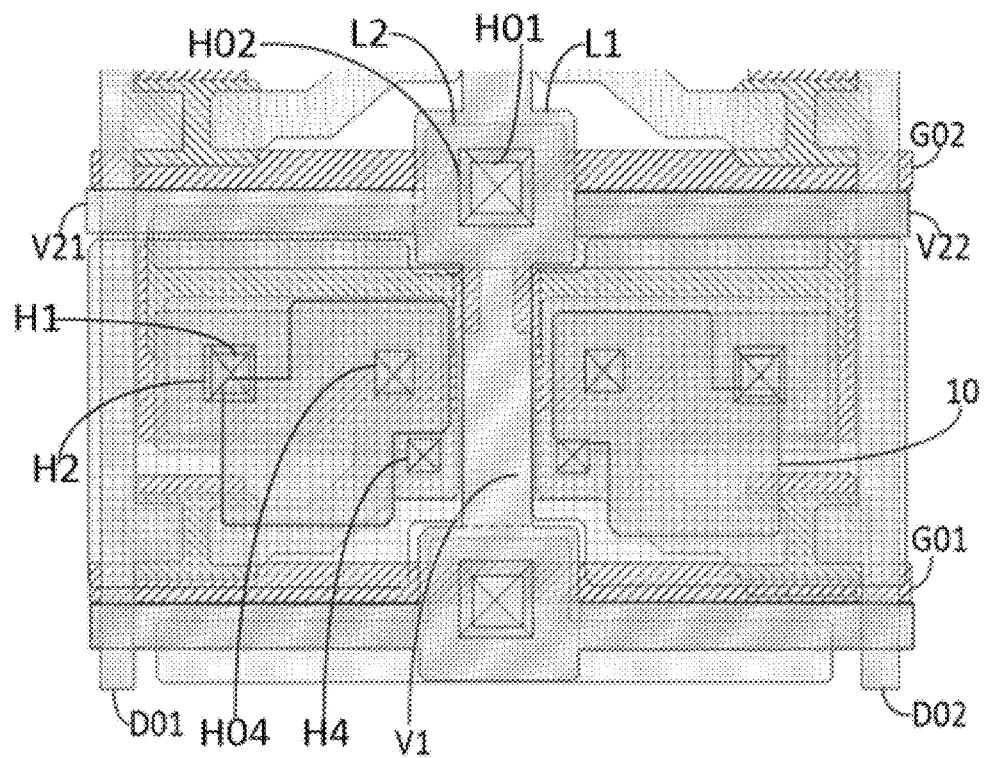
FIG. 12 is a schematic diagram of reference numbers added to via holes on the basis of the back plate shown in FIG. 3.
Figure 13:
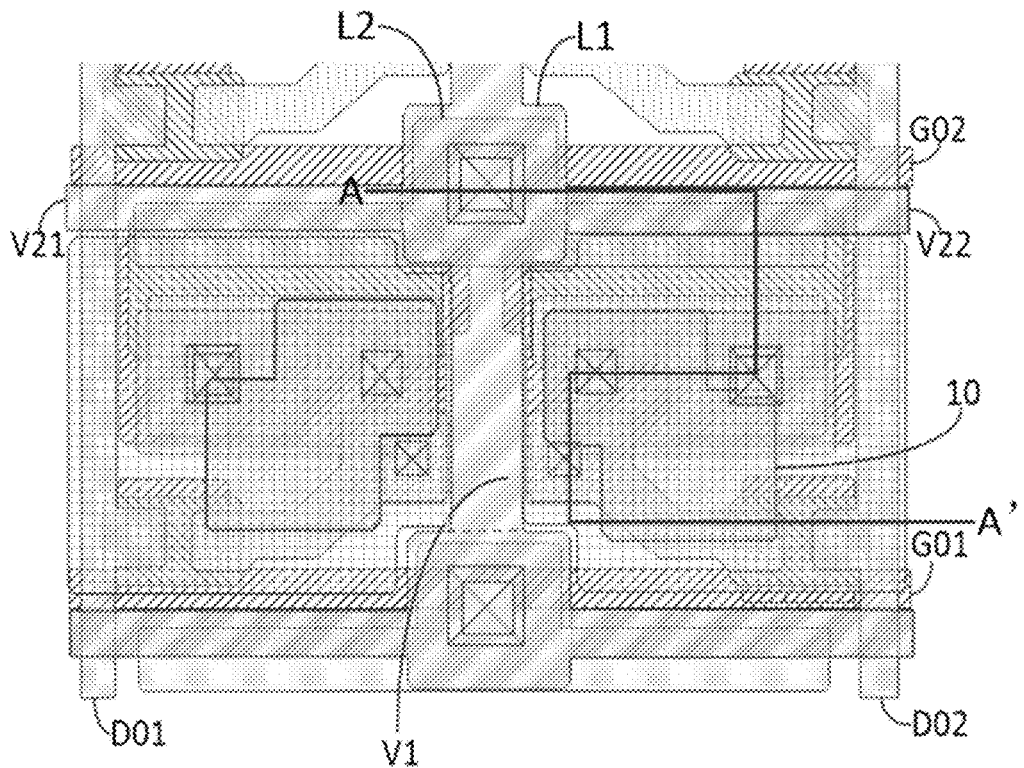
FIG. 13 is the schematic diagram of the A-A' section line added on the basis of FIG. 3.

In FIG. 12, the numbers H01 and H02 are the first via hole and the second via hole, respectively.

As shown in FIG. 14, the orthographic projection of the first via hole H01 on the base substrate and the orthographic projection of the third via hole on the base substrate is within the orthographic projection of the second via hole H02 on the base substrate.

As shown in FIG. 14, the back plate may include a conductive layer A7 and an organic resin layer A6; the conductive layer A7 is arranged on the side of the capacitor electrode layer A9 away from the base substrate 20; the organic resin layer A6 is arranged between the conductive layer A7 and the source-drain metal layer A4; the back plate further includes a first insulating layer A5 arranged between the source-drain metal layer A4 and the organic resin layer A6, and a first insulating layer A5 arranged between the source-drain metal layer A4 and the organic resin layer A6;

A third insulating layer A8 between the conductive layer A7 and the capacitor electrode layer A9; the via holes include a first via hole H01, a second via hole H02 and a third via hole H03.

In FIG. 14, the gate metal layer is labeled A1, the gate insulating layer is labeled A2, the active layer is labeled A3, the second insulating layer is labeled A10, and the pixel electrode layer is labeled A11.

Optionally, both the first insulating layer and the third insulating layer may be passivation layers, but not limited thereto.

As shown in FIG. 14, the orthographic projection of the first via hole H01 on the base substrate 20 is within the orthographic projection of the second via hole H02 on the base substrate 20, and the orthographic projection of the via hole H03 on the base substrate 20 is within the orthographic projection of the second via hole H02 on the base substrate 20.

In at least one embodiment of the present disclosure, due to process limitations, the area of the orthographic projection of H02 on the base substrate is set to be larger than the area of the orthographic projection of H01 on the base substrate, and the area of the orthographic projection of H02 is set to be larger than the area of the orthographic projection of H03 on the base substrate, so as to ensure that H01 can be completely presented and can be completely etched.

Figure 8:
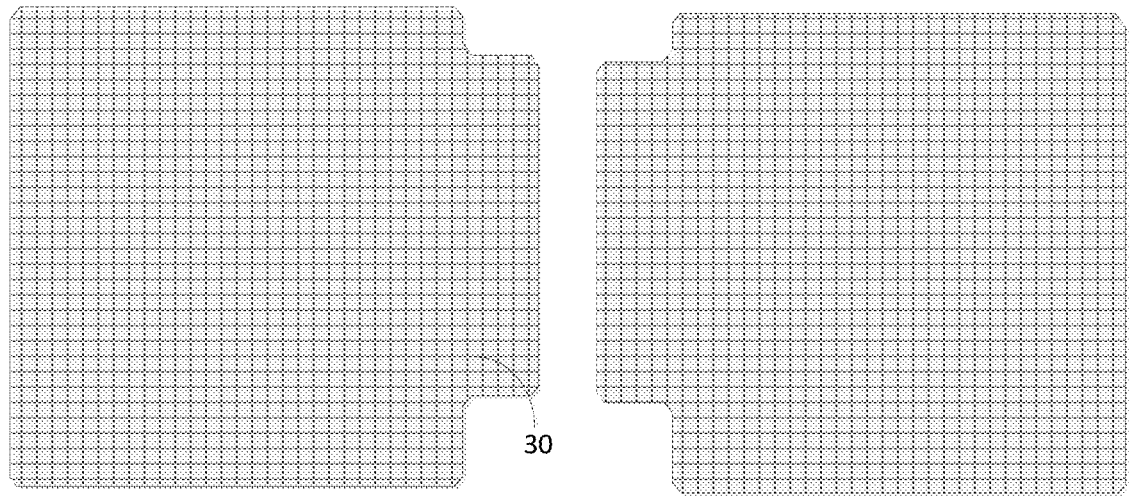
FIG. 8 is a top view of a conductive layer in FIG. 3.

In a specific implementation, as shown in FIG. 8, the conductive layer may include a plurality of conductive patterns 30 independent from each other; the orthographic projection of the conductive patterns 30 on the base substrate covers the pixel area provided with the pixel structure. Moreover, an opening between the conductive patterns 30 may expose the first conductive connection portion L1 and the second conductive connection portion L2 to avoid short circuits.

In a specific implementation, the active layer may be a metal oxide active layer, but not limited thereto.

Optionally, the active layer may be an IGZO layer, wherein the atomic number ratio of indium, gallium, zinc and oxygen may be 1:1:1:4, but not limited thereto.

Optionally, the active layer can be made of IGZXO, and a metal is added on the basis of Indium Gallium Zinc Oxide (IGZO), so as to enhance the resistance to acid corrosion when the source electrode and drain electrode of the transistor are etched, reduce the damage of the back channel, and improve the stability of the thin film transistor (TFT).

In at least one embodiment of the present disclosure, the back plate may include a gate metal layer, the active layer, the source-drain metal layer, the capacitor electrode layer and the a pixel electrode layer that are arranged in sequence on the base substrate, the gate metal layer includes a gate line, a gate electrode of the driving transistor and a gate electrode of the switching transistor, the gate electrode of the driving transistor is multiplexed as the first electrode plate of the storage capacitor, and the active layer includes the active layer pattern of the driving transistor and the active layer pattern of the switching transistor, and the capacitor electrode layer includes a power supply line and a first electrode plate portion in the second electrode plate of the storage capacitor; the source-drain metal layer includes the source electrode of the driving transistor, the drain electrode of the driving transistor, the source electrode of the switching transistor, the drain electrode of the switching transistor, and the second electrode plate portion of the second electrode plate of the storage capacitor; the pixel electrode layer includes a plurality of pixel electrodes independent of each other.

In at least one embodiment of the present disclosure, a stacked structure of gate metal layer, capacitor electrode layer, and source-drain metal layer is used to form a capacitor, so as to simplify the process flow, simplify the pixel structure, reduce the pixel structure area and ensure high driving capability.

At least one embodiment of the present disclosure adopts a stacked structure of a gate metal layer, a capacitor electrode layer, and a source-drain metal layer to form a capacitor, so as to solve the problem that the source electrode of the driving transistor, the drain electrode of the driving transistor, the source electrode of the switching transistor, the drain electrode of the switching transistor, and the second electrode plate of the storage capacitor cannot only be arranged on the same layer due to a small area of the pixel structure.

As shown in FIG. 2 and FIG. 3, the first pixel structure 21 and the second pixel structure 22 are symmetrically arranged on both sides of the power supply line V1 extending along the column direction; the first pixel structure 21 and the second pixel structure 22 are arranged in the same row; the first pixel structure 21 includes a driving transistor, a switching transistor and a first data line D01; the second pixel structure 22 includes a driving transistor, a switching transistor and a second data line D02;

The first pixel structure 21 and the second pixel structure 22 share the first gate line G01 and the power supply line V1; the pixel structures located in the same column may share the same data line.

Figure 5:
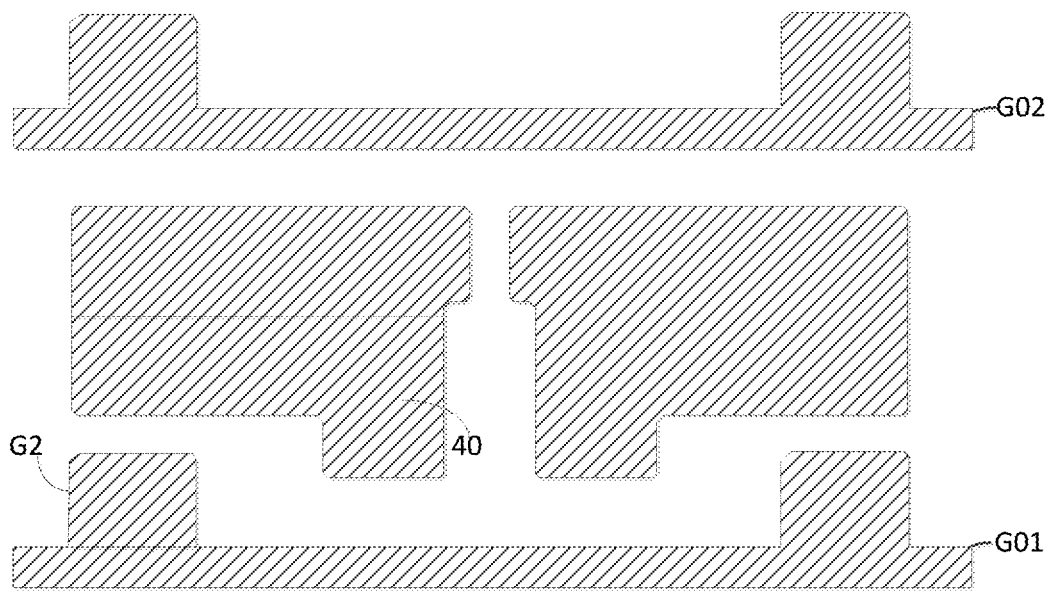
Figure 10:
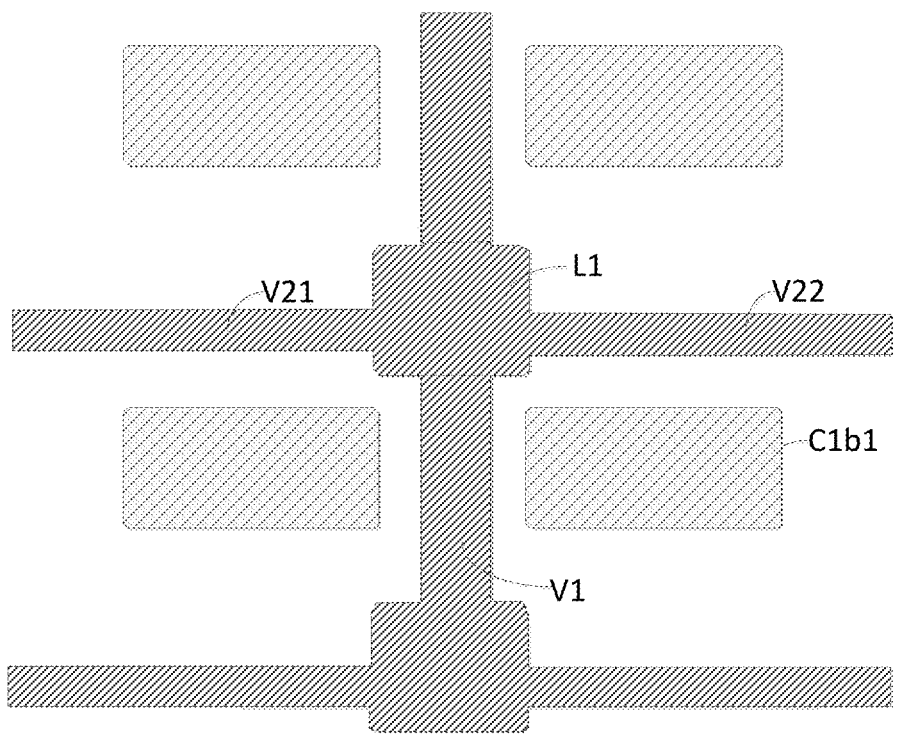
FIG. 10 is a top view of a capacitor electrode layer in FIG. 2.
Figure 11:
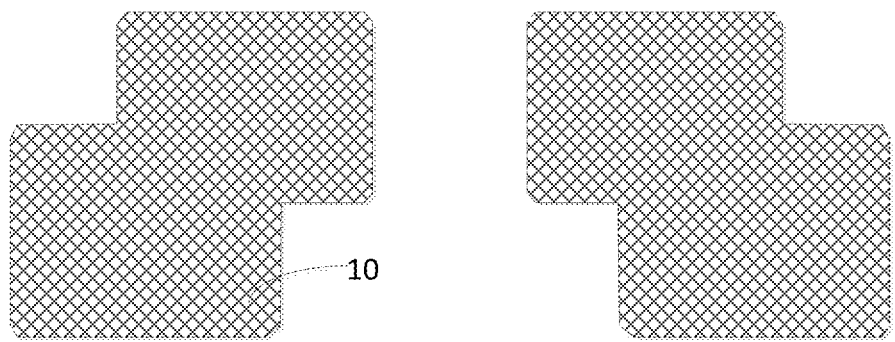
FIG. 11 is a top view of a pixel electrode layer in FIG. 2.

As shown in FIG. 2, the back plate includes a gate metal layer A1, an active layer A3, a source-drain metal layer A4, a capacitor electrode layer A9 and a pixel electrode layer A11 that are sequentially arranged above the base substrate 20;

FIGS. 4 and 5 are top views of the gate metal layer in FIG. 2, FIG. 6 is a top view of the active layer in FIG. 2, FIG. 7 is a top view of the source-drain metal layer in FIG. 2, and FIG. 10 is a top view of the capacitor electrode layer in FIG. 2, FIG. 11 is a top view of the pixel electrode layer in FIG. 2.

The difference between at least one embodiment of the back plate shown in FIG. 3 and at least one embodiment of the back plate shown in FIG. 2 is that a conductive layer and an organic resin layer are added, and a second via hole and a second connection via hole are added.

In FIG. 4 and FIG. 5, the gate line marked G01 is the first gate line, the gate line marked G02 is the second gate line, and G1 is the gate electrode of the driving transistor in the first pixel structure 21. The gate electrode G1 of the driving transistor in the pixel structure 21 is multiplexed as the first electrode plate of the storage capacitor; in FIG. 4 and FIG. 5, G2 is the gate electrode of the switching transistor in the first pixel structure 21, and the gate electrode G2 of the switching transistor in the first pixel structure 21 is the protruding portion of G01; in FIG. 6, the active layer pattern of the driving transistor in the first pixel structure 21 is labeled 51; an active layer pattern of the switching transistor in the pixel structure 21 is labeled 52; in FIG. 7, the source electrode of the driving transistor in the first pixel structure 21 is labeled S1, and the drain electrode of the driving transistor in the first pixel structure 21 is labeled D1, the source electrode of the switching transistor in the first pixel structure 21 is labeled S2, the drain electrode of the switching transistor in the first pixel structure 21 is labeled D2, the extension portion is labeled L3, the extension portion L3 is electrically connected to D2; in FIG. 7, S2 is the protruding portion of D01. In FIG. 8, reference numeral 30 is a conductive pattern included in the conductive layer. In FIG. 10, the reference numeral L1 is the first conductive connection portion, and the reference numeral V1 is the power supply lines arranged in the column direction. In FIG. 11, the pixel electrode is labeled 10.

As shown in FIG. 4 and FIG. 5, the main body portion of G01 is a linear portion extending in the row direction, and G2 and the main body portion of G01 are integrally structured and protrude from the main body portion of G01. As shown in FIG. 7, the main body portion of D01 is a linear portion extending in the column direction, and S2 and the main body portion of D01 are integrally structured and protrude from the main body portion of D01.

In at least one embodiment of the present disclosure, the column direction may be a vertical direction, the row direction may be a horizontal direction, the first side may be a left side, and the second side may be a right side, but it is not limited.

As shown in FIG. 2 and FIG. 3, the first pixel structure 21 and the second pixel structure are symmetrically arranged on opposite sides of the power supply line V1, and a symmetrical pixel structure is adopted to save pixel area, and in at least one embodiment of the present disclosure, the power supply line is arranged on the capacitor electrode layer, so as to further save the pixel area and achieve better resolution; and at least one embodiment of the present disclosure uses low-resistance metal to form the power supply line, and maximizes the line width of the power supply line, to reduce the IR drop under high current (IR drop refers to a phenomenon in which the voltage drops or rises on the power supply and ground network in the integrated circuit) and improve the uniformity of the large-sized back plate.

As shown in FIG. 2, FIG. 3, FIG. 4, FIG. 5, FIG. 6 and FIG. 7, the active layer pattern of the driving transistor includes a first channel portion 511, a first electrode contact portion 512 and a second electrode contact portion 513;

The orthographic projection of the source electrode S1 of the driving transistor on the base substrate at least partially overlaps the orthographic projection of the first electrode contact portion 512 on the base substrate, and the orthographic projection of the drain electrode D1 of the driving transistor on the base substrate at least partially overlaps the orthographic projection of the second electrode contact portion 513 on the base substrate;

The source electrode S1 of the driving transistor is in direct contact with the first electrode contact portion 512, and the drain electrode D1 of the driving transistor is in direct contact with the second electrode contact portion 513;

The first channel portion 511 is arranged between the first electrode contact portion 512 and the second electrode contact portion 513;

The first channel portion 511 extends in the row direction.

As shown in FIG. 6, a ratio between the width of the first channel portion 511 in the row direction and the length of the first channel portion 511 in the column direction (this ratio is also the width-to-length ratio of the driving transistor) is greater than a predetermined ratio.

In at least one embodiment of the present disclosure, the power supply line and the capacitor electrode layer are arranged at the same layer and made of the same material, so that there is enough space for the source electrode of the driving transistor and the drain electrode of the driving transistor in the source-drain metal layer, so that the aspect ratio of the driving transistor is set to be larger to improve the driving capability.

In at least one embodiment shown in FIG. 2 and FIG. 3, the aspect ratio of the driving transistor may be greater than or equal to 4 and less than or equal to 8, for example, the aspect ratio of the driving transistor may be equal to 5, but not limited thereto.

In at least one embodiment of the present disclosure, the predetermined ratio may be greater than or equal to 1 and less than or equal to 12.5, but not limited thereto.

As shown in FIG. 7, the drain electrode D1 of the driving transistor and the second plate portion C1b2 are an integral structure;

As shown in FIG. 2, FIG. 3, FIG. 7 and FIG. 10, a first overlapping area is formed between the orthographic projection of the first electrode plate portion C1b1 on the base substrate and the orthographic projection of the second electrode plate portion C1b2 on the base substrate; the first electrode plate portion C1b1 and the power supply line V1 are independent of each other;

The first electrode plate portion C1b1 is electrically connected to the second electrode plate portion C1b2 through a connection via hole; the connection via hole is arranged in the first overlapping area;

As shown in FIG. 2, FIG. 3, FIG. 10, FIG. 11 and FIG. 12, there is a second overlapping area between the orthographic projection of the first electrode plate portion C1b1 on the base substrate and the orthographic projection of the pixel electrode 10 on the base substrate.

The first electrode plate portion C1b1 is electrically connected to the pixel electrode 10 through a fourth via hole H04 arranged in the second overlapping area.

In FIG. 14, the number H04 is a fourth via hole, and the fourth via hole H04 is a via hole penetrating through the second insulating layer A10.

As shown in FIG. 3, FIG. 7, FIG. 8, FIG. 10 and FIG. 12, the second electrode plate portion C1b2 is electrically connected to the conductive pattern 30 through the first connection via hole H1 and the second connection via hole H2; the conductive pattern 30 is electrically connected to the first electrode plate portion C1a through the third connection via hole.

As shown in FIG. 12, the connection via holes may include a first connection via hole H1, a second connection via hole H2 and a third connection via hole; the orthographic projection of the first connection via hole H1 on the base substrate is within the orthographic projection of the second connection via hole H2 on the base substrate, and the orthographic projection of the third connection via hole on the base substrate is within the orthographic projection of the second connection via hole H2 on the base substrate.

In at least one embodiment corresponding to FIG. 12, the orthographic projection of the first connection via hole H1 on the base substrate overlaps the orthographic projection of the third connection via hole on the base substrate, but not limited to this. In actual operation, the orthographic projection of the first connection via hole on the base substrate may also at least partially overlap the orthographic projection of the third connection via hole on the base substrate.

As shown in FIG. 14, the first connection via hole H1 is a via hole penetrating through the first insulating layer A5, the second connection via hole H2 is a via hole penetrating through the organic resin layer A6, and the third connection via hole H2 is a via hole penetrating through the third insulating layer A8;

The orthographic projection of the first connection via hole H1 on the base substrate is within the orthographic projection of the second connection via hole H2 on the base substrate, and the orthographic projection of the third connection via hole H3 on the base substrate is within the orthographic projection of the second connection via hole H2 on the base substrate.

In at least one embodiment of the present disclosure, due to the limitation of the process, the area of the orthographic projection of H2 on the base substrate is set to be larger than the area of the orthographic projection of H1 on the base substrate, and the area of the orthographic projection of H2 on the base substrate is set to be larger than the area of the orthographic projection of H3 on the base substrate, so as to ensure that H1 can be completely presented and can be completely etched.

As shown in FIG. 2, FIG. 3, FIG. 4, FIG. 5 and FIG. 7, the gate electrode G1 of the driving transistor is multiplexed as the first electrode plate of the storage capacitor; the second plate portion C1b2 and the second electrode D1 of the driving transistor are an integral structure;

In FIG. 10, the label C1b1 is the first electrode plate portion;

As shown in FIG. 2, FIG. 3, FIG. 4, FIG. 5, FIG. 7 and FIG. 10, the orthographic projection of the first electrode plate C1a on the base substrate, the orthographic projection of the first electrode plate portion C1b1 on the base substrate and the orthographic projection of the second electrode plate portion C1b2 on the base substrate at least partially overlap, so as to form a storage capacitor.

As shown in FIG. 2, FIG. 3, FIG. 4, FIG. 5, FIG. 6 and FIG. 7, the active layer pattern of the switching transistor includes a second channel portion 521 (that is, the channel of the active layer pattern of the switching transistor), a third electrode contact portion 522 and a fourth electrode contact portion 523;

The orthographic projection of the source electrode S2 of the switching transistor on the base substrate at least partially overlaps the orthographic projection of the third electrode contact portion 522 on the base substrate, and the orthographic projection of the drain electrode D2 of the switching transistor on the base substrate at least partially overlaps the orthographic projection of the fourth electrode contact portion 523 on the base substrate;

The source electrode S2 of the switching transistor is in direct contact with the third electrode contact portion 522, and the drain electrode D2 of the switching transistor is in direct contact with the fourth electrode contact portion 523;

The second channel portion 521 is arranged between the third electrode contact portion 522 and the fourth electrode contact portion 523.

In a specific implementation, the second electrode of the switching transistor is electrically connected to the extension portion, and there is a third overlapping area between the orthographic projection of the extension portion on the base substrate and the orthographic projection of the first electrode plate of the storage capacitor on the base substrate, and the first electrode plate of the storage capacitor is electrically connected to the extension portion through a fourth connection via hole arranged in the third overlapping area, so that the first electrode plate of the storage capacitor is electrically connected to the second electrode of the switching transistor;

The back plate further includes a gate insulating layer arranged between the gate metal layer and the active layer; The fourth connection via hole is a via hole penetrating through the gate insulating layer.

As shown in FIG. 2, FIG. 3, FIG. 4, FIG. 5 and FIG. 7, the drain electrode D2 of the switching transistor is electrically connected to the extension portion L3, and there is a third overlapping area between the orthographic projection of the extension portion L3 on the base substrate and the orthographic projections of the first electrode plate of the storage capacitor (that is, the gate electrode G1 of the driving transistor) on the base substrate, and the first electrode plate of the storage capacitor is electrically connected to the extension portion L3 through the fourth connection via hole H4 arranged in the third overlapping area, so that the first electrode plate of the storage capacitor is electrically connected to the second electrode D2 of the switching transistor.

In FIG. 14, the reference number H4 is the fourth connection via hole, and the fourth connection via hole H4 is a via hole penetrating through the gate insulating layer A2.

Figure 9:
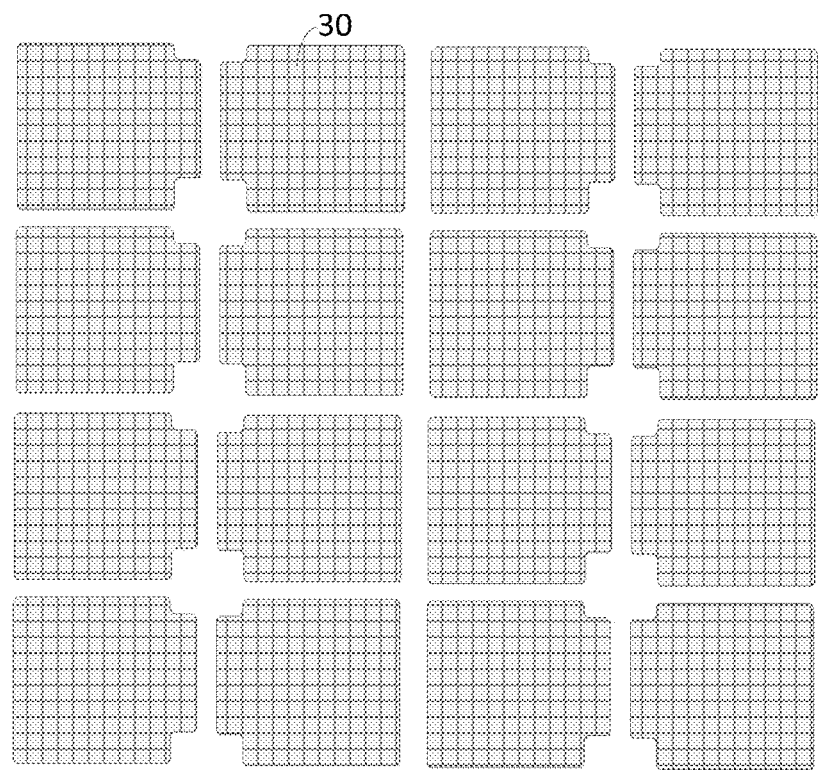
FIG. 9 is a top view of the conductive layer according to one embodiment of the present disclosure.

In at least one embodiment of the present disclosure, as shown in FIG. 9, the conductive layer includes a plurality of conductive patterns 30 independent from each other, and the orthographic projection of the conductive pattern 30 on the base substrate covers a pixel area provided with the pixel structure, as shown in FIG. 9, the conductive layer has openings between the plurality of conductive patterns 30, to expose the first conductive connection portion and the second conductive connection portion and prevent from short circuits.

Optionally, the back plate according to at least one embodiment of the present disclosure may include a gate metal layer, an active layer, an etch barrier layer, a source-drain metal layer, a capacitor electrode layer, and a pixel electrode layer that are sequentially arranged on the base substrate; the etching barrier layer is used to protect the active layer from being etched;

The active layer is electrically connected to the source-drain metal layer through a via hole penetrating the etching barrier layer; the gate electrode of the driving transistor and the gate electrode of the switching transistor are arranged on the gate metal layer; the active layer pattern of the driving transistor and the active layer pattern of the switching transistor are arranged on the active layer; the source electrode of the driving transistor, the drain electrode of the driving transistor, the source electrode of the switching transistor and the drain electrode of the switching transistors are all arranged on the source-drain metal layer; the power supply lines are arranged on the capacitor electrode layer, and the pixel electrodes are arranged on the pixel electrode layer; the pixel electrodes included in different pixel structures are independent of each other;

The drain electrode of the driving transistor is electrically connected to the pixel electrode through the capacitor electrode layer, and there is an overlapping area between the orthographic projection of the capacitor electrode layer on the base substrate and an orthographic projection of the gate electrode of the driving transistor on the base substrate; the drain electrode of the switching transistor is electrically connected to the gate electrode of the driving transistor through an extension portion extending in the direction of the power supply line.

In a specific implementation, an etching barrier layer may be arranged between the active layer and the source-drain metal layer, and the active layer is electrically connected to the source-drain metal layer through a via hole penetrating through the etching barrier layer; the etching barrier layer is used to protect the active layer from being etched, and the etching barrier layer can protect a back channel and prevent the back channel from being damaged by the etching process when the source electrode and the drain electrode are formed.

Figure 15A:
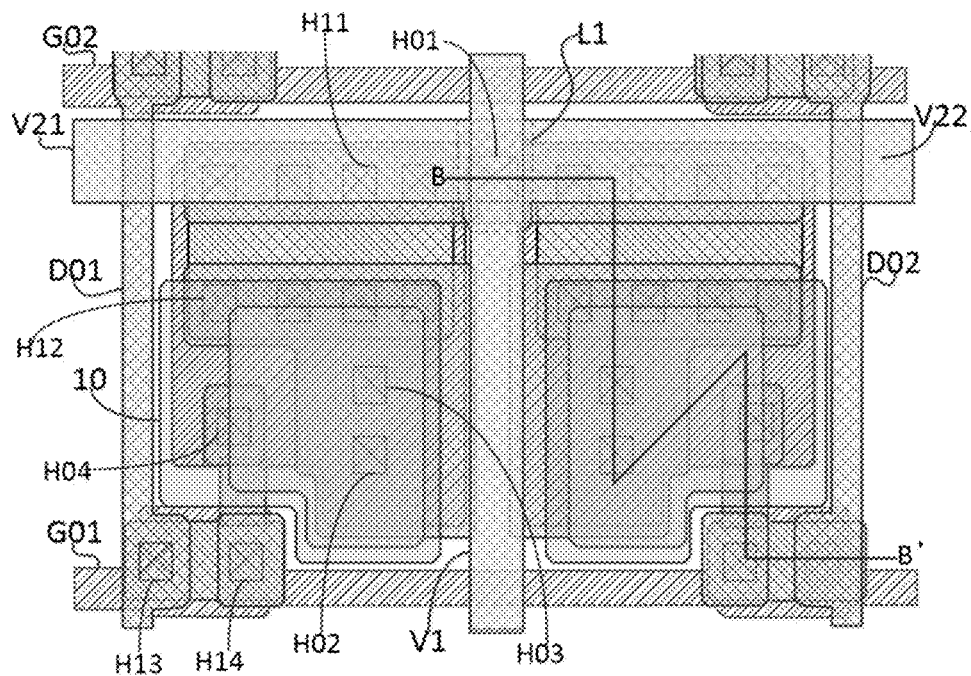
FIG. 15A is a schematic diagram of a layout of a back plate according to at least one embodiment of the present disclosure.
Figure 15B:
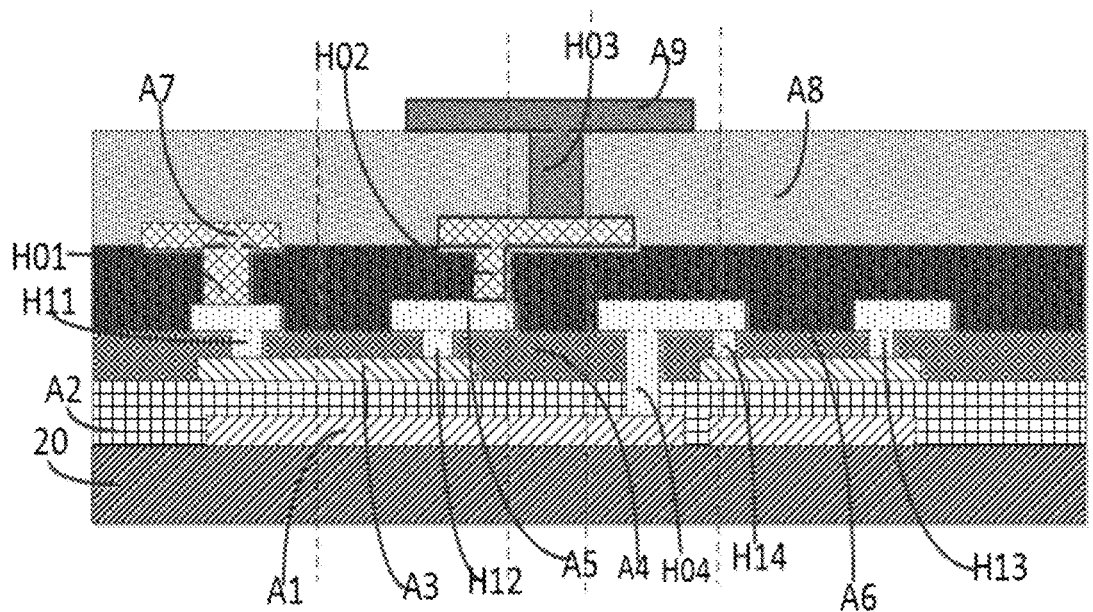
FIG. 15B is a cross-sectional view of the back plate shown in FIG. 15A in the direction B-B'.

As shown in FIGS. 15A and 15B, the back plate according to at least one embodiment of the present disclosure includes a gate metal layer A1, a gate insulating layer A2, an active layer A3, and an etch barrier layer A4, a source-drain metal layer A5, a first insulating layer A6, a capacitor electrode layer A7, a second insulating layer A8 and a pixel electrode layer A9 that are sequentially arranged above the base substrate 20.

In FIG. 15A, the pixel electrode is labeled 10, the power supply line extending in the column direction is labeled V1, the first gate line is labeled G01, the second gate line is labeled G02, and the first data line is labeled D01, and the second data line is labeled D02.

The difference between the layout of the back plate shown in FIG. 15A and the layout of the back plate shown in FIG. 2 is that an etching barrier layer A4 is provided, and the source electrode of the driving transistor is electrically connected to the active layer pattern of the driving transistor through the first electrode via hole, the drain electrode of the driving transistor is electrically connected to the active layer pattern of the driving transistor through at least one second electrode via hole, and the source electrode of the switching transistor is electrically connected to the active layer pattern of the switching transistor through the third electrode via hole, the drain electrode of the switching transistor is electrically connected to the active layer pattern of the switching transistor through the second electrode via hole; the size and position of each via hole; and the shape of the power supply line.

As shown in FIG. 15A and FIG. 15B, the first electrode via hole H11, the second electrode via hole H12, the third electrode via hole H13 and the fourth electrode via hole H14 are via holes penetrating the etching barrier layer.

As shown in FIG. 15A, the first conductive connection portion included in the power supply line is labeled L1, as shown in FIGS. 15A and 15B, L1 is electrically connected to the second conductive connection portion (the second conductive connection portion is arranged on the source-drain metal layer) through the first via hole H01 penetrating the first insulating layer A6.

In at least one embodiment shown in FIG. 15A and FIG. 15B, the gate electrode of the driving transistor is multiplexed as the first electrode plate of the storage capacitor; the drain electrode of the driving transistor and the second electrode plate are an integral structure; the second electrode plate portion is electrically connected to the first electrode plate portion through a second via hole H02; the first electrode plate portion is electrically connected to the pixel electrode 10 through a third via hole H03.

As shown in FIG. 15A and FIG. 15B, the orthographic projection of the second via hole H02 on the base substrate does not overlap with the orthographic projection of the third via hole H03 on the base substrate to avoid the occurrence of disconnection, but not limited to this.

When the back plate described in at least one embodiment of the present disclosure is manufactured, when the capacitor electrode layer is deposited, the position of the second via hole H02 will be sunk. If the orthographic projection of H03 on the base substrate overlaps the orthographic projection of H02 on the base substrate, the first plate portion C1b1 may not be electrically connected to the pixel electrode 10 through the third via hole H03 arranged in the third overlapping area. During operation, the orthographic projection of the second via hole H02 on the base substrate does not overlap the orthographic projection of the third via hole H03 on the base substrate.

In at least one embodiment shown in FIGS. 15A and 15B, the drain electrode of the switching transistor is electrically connected to the extension portion, and the gate electrode of the driving transistor (i.e., the first electrode plate of the storage capacitor) is electrically connected to the extension portion through the fourth via hole hole H04 (H04 is a via hole penetrating the gate insulating layer and the etch barrier layer), so that the first electrode plate of the storage capacitor is electrically connected to the drain electrode of the switching transistor.

Figure 16:
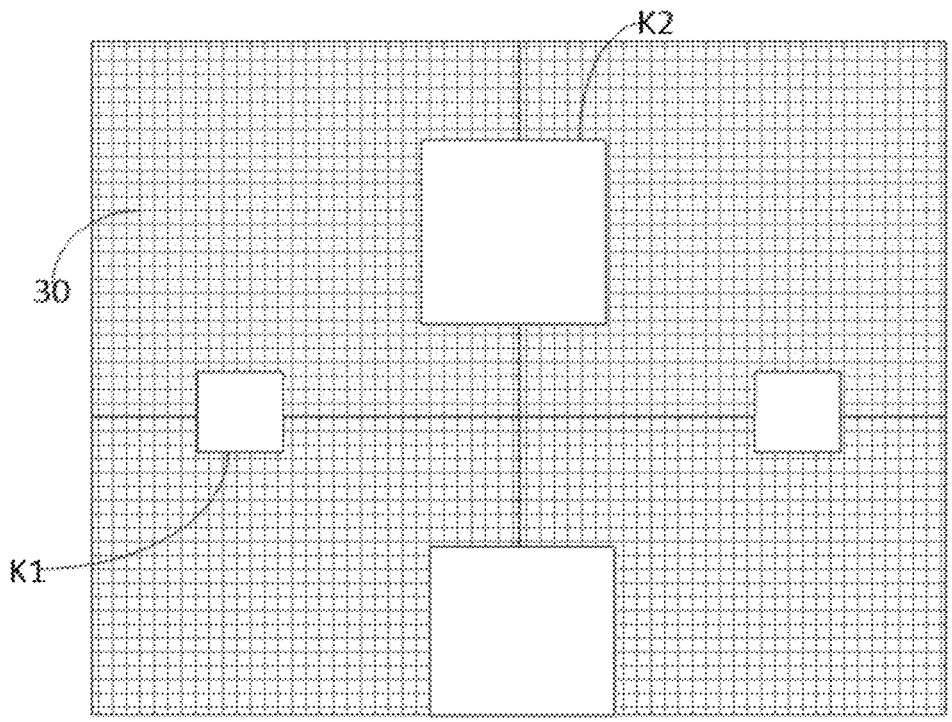
FIG. 16 is a top view of another conductive layer used in the back plate shown in FIG. 3.

In at least one embodiment of the back plate shown in FIG. 3, the structure of the conductive layer can be replaced with the structure shown in FIG. 16.

As shown in FIG. 16, the conductive layer may include a plurality of first openings K1 and a plurality of second openings K2, the third connection via holes pass through the first openings K1; the second openings K2 expose the first conductive connection portion and the second conductive connection portion to avoid short circuit.

Using the structure of the conductive layer shown in FIG. 16, the second electrode plate portion can be directly electrically connected to the first electrode plate portion through the first connection via hole, the second connection via hole and the third connection via hole, the conductive layer is not necessary for connection. Therefore, when manufacturing the substrate according to at least one embodiment of the present disclosure, the first insulating layer and the organic resin layer may be formed in sequence on the side of the source-drain metal layer away from the base substrate, then form a second connection via hole penetrating the organic resin layer, and then form the third insulating layer on the side of the organic resin layer away from the first insulating layer, and then form a first connection via hole penetrating the first insulating layer and a third connection via hole penetrating the third insulating layer by using the same dry etching process, in this way, a mask can be saved and production costs can be saved.

As shown in FIG. 16, the conductive patterns 30 included in the conductive layer may be continuous with each other, which can improve pixel uniformity.

In actual operation, in order to avoid the problem of ESD (Electro-Static discharge), the conductive pattern may be connected to a suitable potential, for example, the conductive pattern may be grounded, but not limited thereto.

In at least one embodiment of the present disclosure, on the premise of not affecting the characteristics of a TFT, the conductive pattern can also be electrically connected to other voltage signal lines in the display panel.

In at least one embodiment of the present disclosure, the conductive layer does not serve as a connection layer between metal layers, and the capacitor electrode layer is directly electrically connected to the pixel electrode layer through a via hole, which can reduce contact resistance.

In at least one embodiment of the present disclosure, as shown in FIG. 2, FIG. 3, and FIG. 15A, the power supply line labeled V21 is the first power supply line extending in the row direction included in the power supply line, and the power supply line labeled V22 is the second power supply line extending in the row direction. In at least one embodiment of the present disclosure, the power supply lines may be arranged in a grid shape, the first conductive connection portion L1 is arranged between V21 and V22, the length of L1 along the row direction is greater than the length of V1 along the row direction, and the length of L1 along the column direction is greater than the length of V21 along the column direction, and the length of L1 along the column direction is greater than the length of V22 along the column direction, but not limited thereto. L1, V21, V22 and V1 are electrically connected to each other.

In at least one embodiment of the present disclosure, the power supply lines are arranged in a grid shape to maximize the line width, and low-resistance metals can be used to make the power supply lines to reduce the IR voltage drop under high current (IR voltage drop refers to a phenomenon in which the voltage drops or rises on the power supply and ground network in an integrated circuit), and to improve the uniformity of a large-scale back plate.

In at least one embodiment of the present disclosure, the 3D printing system may include a printing box and the above-mentioned back plate; the printing box accommodates an electrolyte; the printing box includes a first cover plate and a second cover plate oppositely arranged; the back plate is arranged on the side of the first cover plate close to the second cover plate, so that each pixel electrode of the back plate faces the electrolyte; a cathode for printing is arranged at a side of the second cover plate close to the first cover plate.

In a specific implementation, the back plate includes a pixel structure and a pixel electrode arranged on the base substrate; the pixel structure is used to control the connection or disconnection between the power supply line and pixel electrode according the data voltage on the data line in a corresponding column under the control of according to the gate driving signal on the gate line in the corresponding row, so as to control the position of the metal ions to be printed in the electrolyte deposited on the second cover plate, and finally form a 3D pattern to achieve high precision printing.

In at least one embodiment of the present disclosure, when the back plate is an anode back plate for 3D printing, the pixel electrode is an electrochemical anode, and the electrochemical anode and the cathode may be arranged in the same closed cavity structure, the closed cavity structure accommodates an electrolyte, and the electrolyte is a metal salt solution to be printed. For example, when the printing metal is copper, the electrolyte can be a copper sulfate solution, or other copper metal salt solutions. In addition, in the closed cavity structure, the back plate is arranged opposite to the cathode back plate (the cathode back plate is provided with a cathode), and the electrolyte, the electrochemical anode and the cathode form an electrochemical loop; a voltage is applied between the electrochemical anode and the cathode, and the copper ions move to the vicinity of the cathode and are deposited on the cathode back plate to form a 3D pattern.

The back plate provided by the present disclosure can at least be used for a printing back plate in a 3D printing system, the back plate includes printing anodes, which are distributed in an array, and the back plate drives the anodes to realize 3D printing. Alternatively, the back plate provided in this disclosure can at least be used in the display field to drive pixel electrodes (in this case, the anode of the back plate can be a pixel electrode, but not limited thereto) to realize liquid crystal display or OLED display.

The back plate according to at least one embodiment of the present disclosure includes a base substrate, gate lines, data lines and power supply lines arranged on the base substrate crossing to each other in rows and columns, and pixel structures arranged in an array on the base substrate;

The pixel structure includes a pixel electrode of the back plate located on the base substrate, a driving transistor electrically connected to the pixel electrode, and a switching transistor electrically connected to the driving transistor; the pixel electrode may be the anode;

The gate line extends along the row direction of the array and is located on a side of the pixel structure close to the next row of pixel structures, the power supply line includes a power supply line extending along the column direction; the data line and the power supply line extending along the column direction are located on opposite sides of the pixel structure;

In the pixel area where the pixel structure is located, the driving transistor and the switching transistor are arranged in sequence along the column direction;

The gate electrode of the driving transistor extends from the data line to the power supply line in the row direction, and the gate electrode of the driving transistor extends from the gate line of the previous row of pixel structures to the switching transistor in the column direction;

The width direction of the channel in the active layer pattern of the driving transistor is the row direction, and the channel extends from the data line located on one side of the pixel structure to the power supply line located on the other side of the pixel structure in the row direction;

The source electrode of the driving transistor and the drain electrode of the driving transistor respectively extend in the row direction, and the source electrode of the driving transistor and the drain electrode of the driving transistor are arranged in sequence in the column direction; the source electrode of the driving transistor and the drain electrode of the driving transistor are arranged between the active layer pattern of the driving transistor and the base substrate, or the source electrode of the driving transistor and the drain electrode of the driving transistor are arranged on a side of the active layer pattern away from the base substrate;

The gate electrode of the driving transistor is connected to the drain electrode of the switching transistor, the source electrode of the driving transistor is electrically connected to the power supply line, and the drain electrode of the driving transistor is electrically connected to the pixel electrode;

The source electrode of the switching transistor is electrically connected to the data line, and the gate electrode of the switching transistor is electrically connected to the gate line.

In at least one embodiment of the present disclosure, in the same row of pixel structures or the same column of pixel structures, a power supply line may be provided between the (2n−1)th pixel structure and the 2n-th pixel structure, and the power supply line is connected to the source electrode of the driving transistor in the (2n−1)th pixel structure and the source electrode of the driving transistor in the 2n-th pixel structure; n is a positive integer greater than or equal to 1.

In the back plate according to at least one embodiment of the present disclosure, in the pixel area where the pixel structure is located, the driving transistors and the switching transistors are arranged in sequence along the column direction, and the gate electrodes of the driving transistors extend in the row direction from the data line located on one side of the pixel structure to the power supply line located on the other side of the pixel structure, to occupy most of the pixel area in the row direction, and the gate electrode of the driving transistor extends in the column direction from the gate line of the previous row of pixel structures to the switching transistor, so that the gate electrode of the driving transistor occupies most of the pixel area in the column direction, and the driving transistor and the switching transistor are arranged in compact, and the channel in the active layer pattern of the driving transistor extends in the row direction from the data line located on one side of the pixel structure to the power supply line located on the other side of the pixel structure, so that the aspect ratio of the driving transistor is large, so as to improve the driving capability of the driving transistor.

In at least one embodiment of the present disclosure, the source electrode of the driving transistor and the drain electrode of the driving transistor may be arranged on a source-drain metal layer, and the source-drain metal layer may be arranged between the active layer of the driving transistor and the base substrates, or the source-drain metal layer may be arranged on a side of the active layer away from the base substrate.

In a specific implementation, the data line and the power supply line extending in the column direction are located on opposite sides of the pixel structure, the data line may be located on the first side of the pixel structure, and the power supply line extending in the column direction is located on the second side of the pixel structure, and the first side and the second side are opposite sides.

In at least one embodiment of the present disclosure, the gate electrode of the driving transistor extending in the row direction from the data line to the power supply line refers to: in the row direction, the extension direction of the gate electrode of the driving transistor is from the data line to the power supply line, wherein the data line may be a data line located on the first side of the pixel structure where the driving transistor is located, and the power supply line may be a power supply line extending along the column direction and located on the second side of the pixel structure where the driving transistor is located, but not limited to this.

In at least one embodiment of the present disclosure, the gate electrode of the driving transistor extending in the column direction from the gate line of the previous row of pixel structures to the switching transistor refers to: in the column direction, the extension direction of the gate electrode of the driving transistor is from the gate line of the previous row of the pixel structures to the switching transistor;

In at least one embodiment of the present disclosure, the channel extending in the row direction from the data line located on one side of the pixel structure to the power supply line located on the other side of the pixel structure refers to: in the row direction, the extending direction of the channel is from the data line located on one side of the pixel structure to the power supply line located on the other side of the pixel structure.

In a specific implementation, the gate line has a first protruding portion, and the data line has a second protruding portion;

The width direction of the channel of the active layer pattern of the switching transistor is perpendicular to the width direction of the channel of the driving transistor, the gate electrode of the switching transistor is the first protruding portion, and the source electrode of the switching transistor is the second protruding portion;

The drain electrode of the switching transistor and the extension portion are an integral structure, the extension portion extends toward the power supply line, and the orthographic projection of the extension portion on the base substrate at least partially overlaps the orthographic projection of the gate electrode of the driving transistor on the base substrate, and the drain electrode of the switching transistor is electrically connected to the gate electrode of the driving transistor through a via hole.

In actual operation, the gate electrode of the switching transistor is the first protruding portion of the gate line, the source electrode of the switching transistor is the second protruding portion of the data line, and the drain electrode of the switching transistor is connected to the gate electrode of the driving transistor through the extension portion, and the extension portion extends toward the power supply line, so that the layout of the switching transistor and the driving transistor is compact.

In a preferred case, two adjacent columns of pixel structures in the same row of pixel structures are arranged symmetrically, and the symmetrical pixel structures are adopted to save the pixel area and improve the aspect ratio of the driving transistor.

Optionally, the adjacent two columns of pixel structures may be symmetrically arranged on opposite sides of the power supply line, or the adjacent pixel structures may also be symmetrically arranged on opposite sides of the data line.

In a specific implementation, two adjacent columns of pixel structures in a row of pixel structures may be symmetrically arranged on both sides of the power supply line; two pixel structures symmetrically arranged on both sides of the power supply line share one power supply line, so that the power supply line is located between the two driving transistors symmetrically arranged; the data lines symmetrically arranged in the two pixel structures on both sides of the power supply line are located on one side of the pixel structure away from the power supply line.

In at least one embodiment of the present disclosure, when two adjacent columns of pixel structures are symmetrically arranged on both sides of the power supply line, the two adjacent columns of pixel structures can share the power supply line to save pixel area; and, the first data line in the first pixel structure is located on the side of the first pixel structure away from the power supply line, and the second data line in the second pixel structure is located on the side of the second pixel structure away from the power supply line, so as to increase the area of the pixel structure, and improve the aspect ratio of the driving transistor in the pixel structure. Wherein, the first pixel structure and the second pixel structure are symmetrically arranged on both sides of the power supply line.

Optionally, the source electrodes of the two driving transistors in the two pixel structures symmetrically arranged are connected to each other and form an integral structure, and the two driving transistors in the two pixel structures symmetrically arranged may share a source electrode, so as to improve the aspect ratio of the driving transistor.

As shown in FIG. 2 and FIG. 7, the source electrode S1 of the driving transistor in the first pixel structure 21 is connected to the source electrode of the driving transistor in the second pixel structure 22, and the source electrode S1 of the driving transistor in the first pixel structure 21 and the source electrode of the driving transistor in the second pixel structure 22 form an integral structure.

In at least one embodiment of the present disclosure, the 3D printing system may further include a cathode back plate; the back plate and the cathode back plate are arranged opposite to each other;

The cathode back plate is arranged on the side of the second cover plate close to the first cover plate, and the cathode is arranged on the side of the cathode back plate close to the back plate.

In at least one embodiment of the present disclosure, the anode may be an electrochemical anode, and the back plate may be a TFT array substrate. By controlling the on and off of the driving transistor in the pixel structure in the back plate, the current conduction path is controlled, so as to control the position where the metal ions to be printed in the electrolyte are deposited on the cathode back plate, and finally form a 3D pattern.

In at least one embodiment of the present disclosure, the power supply line may be electrically connected to the positive electrode of the electrochemical DC power supply, but not limited thereto.

The back plate described in at least one embodiment of the present disclosure may include pixel structures arranged in an array on a base substrate, and the pixel structure may be as shown in FIG. 1a.

During operation of at least one embodiment of the pixel structure shown in FIG. 1a, under the control of the gate driving signal provided by the gate line G0, T2 is turned on, so as to provide the data voltage on the data line DO to the gate electrode of T1. Under the control of the potential of the gate electrode of T1, T1 controls the connection or disconnection between the power supply line V1 and the pixel electrode 10; C1 is used to maintain the potential of the gate electrode of T1; the pixel electrode 10 can be the anode.

In at least one embodiment of the present disclosure, the back plate may be an anode back plate for 3D printing, and the pixel structure may not be a pixel structure in a display module, but a pixel structure in an electrochemical anode array, but not limited thereto.

The anode back plate for 3D printing according to at least one embodiment of the present disclosure includes a base substrate, gate lines, data lines and power supply lines arranged on the base substrate with crossing to each other in rows and columns, and pixel structures arranged in an array on a base substrate;

The pixel structure includes a pixel electrode of the anode back plate located on the base substrate, a driving transistor electrically connected to the pixel electrode, and a switching transistor electrically connected to the driving transistor; the pixel electrode can be anode;

The gate line extends along the row direction of the array and is located on the side of the pixel structure close to the next row of pixel structures; the power supply line includes a power supply line extending along the column direction; the data line and the power supply line extending along the column direction are located on opposite sides of the pixel structure;

In the pixel area where the pixel structure is located, the driving transistor and the switching transistor are arranged in sequence along the column direction;

The gate electrode of the driving transistor extends in the row direction from the data line to the power supply line, and the gate electrode of the driving transistor extends in the column direction from the gate line of the previous row of pixel structures to the switching transistor;

The width direction of the channel in the active layer pattern of the driving transistor is the row direction, and the channel extends in the row direction from the data line located on one side of the pixel structure to the power supply line located on the other side of the pixel structure.

The source electrode of the driving transistor and the drain electrode of the driving transistor respectively extend along the row direction, and the source electrode of the driving transistor and the drain electrode of the driving transistor are sequentially arranged along the column direction;

The gate electrode of the driving transistor is connected to the drain electrode of the switching transistor, the source electrode of the driving transistor is electrically connected to the power supply line, and the drain electrode of the driving transistor is electrically connected to the pixel electrode;

The source electrode of the switching transistor is electrically connected to the data line, and the gate electrode of the switching transistor is electrically connected to the gate line;

The drain electrode of the driving transistor is electrically connected to the pixel electrode through a capacitor electrode layer; the capacitor electrode layer and the extension portion of the gate electrode of the driving transistor have an overlapping area on the base substrate, and the capacitor electrode layer at least forms a capacitor with the extension of the gate electrode;

The anode back plate for 3D printing further includes a conductive layer including metal arranged between the drain electrode of the driving transistor and the capacitor electrode layer; the orthographic projection of the conductive layer on the base substrate covers the orthographic projection of the active layer pattern on the base substrate.

In the anode back plate for 3D printing described in at least one embodiment of the present disclosure, in the same row of pixel structures or the same column of pixel structures, a power supply line may be provided between the (2n−1)th pixel structure and the 2n-th pixel structure line, the power supply line is connected to the source electrode of the driving transistor in the (2n−1)th pixel structure and the source electrode of the driving transistor in the 2n-th pixel structure; n is a positive integer greater than or equal to 1.

In the anode back plate for 3D printing according to at least one embodiment of the present disclosure, in the pixel area where the pixel structure is located, the driving transistor and the switching transistor are arranged in sequence along the column direction, and the gate electrode of the driving transistor extends in the row direction from the data lines on one side of the pixel structure to the power supply lines on the other side of the pixel structure, to occupy most of the pixel area in the row direction, and the gate electrode of the driving transistor extends in the column direction from the gate line of the previous row of pixel structures to the switching transistor, so that the gate electrode of the driving transistor occupies most of the pixel area in the column direction, and the layout of the driving transistor and the switching transistor is compact, and the channel in the active layer pattern of the driving transistor extends in the row direction from the data line located on one side of the pixel structure to the power supply line located on the other side of the pixel structure, so that the aspect ratio of the driving transistor is large, so as to improve the driving capability of the driving transistor.

In at least one embodiment of the present disclosure, the source electrode of the driving transistor and the drain electrode of the driving transistor may be arranged on a source-drain metal layer, and the source-drain metal layer may be arranged on the active layer of the driving transistor and the base substrates, or the source-drain metal layer may be arranged on a side of the active layer away from the base substrate.

In a specific implementation, the data lines and the power supply lines extending in the column direction are located on opposite sides of the pixel structure, the data lines may be located on the first side of the pixel structure, and the power supply lines extending in the column direction are located on the second side of the pixel structure, and the first side and the second side are opposite sides.

In at least one embodiment of the present disclosure, the gate electrode of the driving transistor extends in the row direction from the data line to the power supply line refers to: in the row direction, the extension direction of the gate electrode of the driving transistor is from the data line to the power supply line, wherein the data line may be a data line located on the first side of the pixel structure where the driving transistor is located, and the power supply line may be a power supply line extending along the column direction and located on the second side of the pixel structure where the driving transistor is located, but not limited to this.

In at least one embodiment of the present disclosure, the gate electrode of the driving transistor extends in the column direction from the gate line of the previous row of pixel structures to the switching transistor refers to: in the column direction, the extension direction of the gate electrode of the driving transistor is from the gate line of the previous row of pixel structures to the switching transistor;

In at least one embodiment of the present disclosure, the channel extending in the row direction from the data line located on one side of the pixel structure to the power supply line located on the other side of the pixel structure refers to: in the row direction, the extending direction of the channel is from the data line located on one side of the pixel structure to the power supply line located on the other side of the pixel structure.

In a specific implementation, the gate line has a first protruding portion, and the data line has a second protruding portion;

The width direction of the channel of the active layer pattern of the switching transistor is perpendicular to the width direction of the channel of the driving transistor, the gate electrode of the switching transistor is the first protruding portion, and the source electrode of the switching transistor is the second protruding portion;

The drain electrode of the switching transistor and the extension portion form an integral structure, the extension portion extends toward the power supply line, and the orthographic projection of the extension portion on the base substrate partially overlaps the orthographic projection of the gate electrode of the driving transistor on the base substrate, and the drain electrode of the switching transistor is electrically connected to the gate electrode of the driving transistor through a via hole.

In actual operation, the gate electrode of the switching transistor is the first protruding portion of the gate line, the source electrode of the switching transistor is the second protruding portion of the data line, and the drain electrode of the switching transistor is connected to the gate electrode of the driving transistor through the extension portion. The extension portion extends toward the power supply line, so that the layout of the switching transistor and the driving transistor is compact.

As shown in FIG. 2, the anode back plate for 3D printing according to at least one embodiment of the present disclosure includes a base substrate and pixel structures arranged in an array on the base substrate;

A left pixel structure (the left pixel structure is the first pixel structure 21 on the left in FIG. 2) includes a power supply line, a first gate line G01 and a first data line D01 crossing in rows and columns, a pixel electrode 10 of the anode back plate located on the base substrate, a driving transistor electrically connected to the pixel electrode 10, and a switching transistor electrically connected to the driving transistor;

The first gate line G01 extends along the row direction of the array and is located on the side of the pixel structure close to the next row of pixel structures; the power supply line includes a power supply line V1 extending along the column direction; the first data line D01 and the power supply lines V1 extending along the column direction are located on opposite sides of the first pixel structure 21; D01 is located on the left side of the first pixel structure 21, and V1 is located on the right side of the first pixel structure 21;

In the pixel area where the first pixel structure 21 is located, the driving transistor and the switching transistor are arranged in sequence along the column direction;

As shown in FIG. 2 and FIG. 4, the gate electrode G1 of the driving transistor in the first pixel structure 21 extends in the row direction from the first data line D01 to the power supply line V1, and the gate electrode G1 of the driving transistor extends in the column direction from the gate line of the previous row of pixel structures (in FIG. 2, the gate line of the previous row of pixel structure is the second gate line G02) to the switching transistor;

As shown in FIG. 2 and FIG. 6, the width direction of the channel 511 in the active layer pattern of the driving transistor is the row direction, and the channel 511 extends in the row direction from the first data line D01 to the power supply line V1;

As shown in FIG. 2 and FIG. 7, the source electrode S1 of the driving transistor and the drain electrode D1 of the driving transistor respectively extend in the row direction, and the source electrode S1 of the driving transistor and the drain electrode D1 of the driving transistor are arranged in sequence along the column direction; the source electrode S1 of the driving transistor and the drain electrode D1 of the driving transistor are both located in the source-drain metal layer, and the source-drain metal layer is arranged on a side of the active layer away from the base substrate.

In a specific implementation, the capacitor electrode layer not only serves as a connection layer, but also serves as an electrode of a storage capacitor.

As shown in FIG. 2, FIG. 4, FIG. 5, FIG. 6 and FIG. 10, the length of the gate electrode G1 of the driving transistor in the column direction is greater than the length of the active layer pattern 51 of the driving transistor in the column direction, so that the gate electrode G1 of the driving transistor extends towards the switching transistor relative to the active layer, and the projection of the extended portion 40 of the gate electrode G1 and the active layer pattern 51 of the driving transistor on the substrate have no overlapping area;

The drain electrode D1 of the driving transistor is electrically connected to the pixel electrode 10 through a capacitor electrode layer;

As shown in FIG. 2, FIG. 4, FIG. 5 and FIG. 10, there is an overlapping area between the capacitor electrode layer and the extension portion 40 of the gate electrode G1 on the base substrate, and the capacitor electrode layer at least forms a capacitor with the extended portion 40 of the gate electrode.

In at least one embodiment of the present disclosure, the anode back plate for 3D printing further includes a conductive layer including metal arranged between the drain electrode of the driving transistor and the capacitor electrode layer; the orthographic projection of the conductive layer on the base substrate covers the pixel area provided with the pixel structure, the orthographic projection of the conductive layer on the base substrate covers the orthographic projection of the active layer pattern of the driving transistor on the base substrate and the orthographic projection of the active layer pattern of the transistor on the base substrate, to prevent the active layer pattern from being damaged.

According to a specific embodiment, the conductive layer may include a plurality of conductive patterns independent from each other; the orthographic projection of the conductive pattern on the base substrate covers the orthographic projection of the active layer pattern on the base substrate.

According to another specific embodiment, the conductive patterns included in the conductive layer may be continuous, and the orthographic projection of the conductive pattern on the base substrate covers the orthographic projection of the active layer pattern on the base substrate.

As shown in FIG. 2 and FIG. 4, the first gate line G01 has a first protruding portion, the main body of the first gate line G01 extends in the row direction, the first protruding portion protrudes from the main body of G01, and the gate electrode G2 of the switching transistor is the first protruding portion, so that the position occupied by the switching transistor is small;

As shown in FIG. 2 and FIG. 7, the first data line D01 has a second protruding portion, the main body of the first data line D01 extends in the column direction, the second protruding portion protrudes from the main body of D01, the source electrode S2 of the switching transistor is the second protruding portion, so that the position occupied by the switching transistor is small.

In a preferred case, two adjacent columns of pixel structures in the same row of pixel structures are symmetrically arranged, and a symmetrical pixel structure is adopted to save the pixel area and improve the aspect ratio of the driving transistor.

In specific implementation, two adjacent columns of pixel structures in a row of pixel structures can be symmetrically arranged on both sides of the power supply line; two pixel structures symmetrically arranged on both sides of the power supply line share one power supply line, thereby saving energy pixel area. The power supply line is located between two driving transistors symmetrically arranged; the data lines in the two pixel structures that are symmetrically arranged on both sides of the power supply line are located on one side of the pixel structure away from the power supply line, which is beneficial to increase the area of the pixel structure and improve the aspect ratio of the driving transistor in the pixel structure.

As shown in FIG. 2, the first pixel structure 21 and the second pixel structure 22 are symmetrically arranged on both sides of the power supply line V1; the first pixel structure 21 and the second pixel structure 22 share the power supply line V1; the power supply line is located between the driving transistor included in the first pixel structure 21 and the driving transistor included in the second pixel structure 22; the first pixel structure 21 includes a first data line D01, and the second pixel structure 22 includes a second data line D02, the first data line D01 is located on the side of the first pixel structure 21 away from the power supply line V1, and the second data line D02 is located on the side of the second pixel structure 22 away from the power supply line V1.

As shown in FIG. 2 and FIG. 7, the source electrode S1 of the driving transistor in the first pixel structure 21 and the source electrode of the driving transistor in the second pixel structure 22 form an integral structure.

Optionally, the drain electrode of the driving transistor is located in the source-drain metal layer, the anode is located in the anode layer, the capacitor electrode layer A9 is located between the source-drain metal layer A4 and the anode layer A11, and a first insulating layer A5 is provided between the capacitor electrode layer A9 and the source-drain metal layer A4, a second insulating layer A10 is provided between the capacitor electrode layer A9 and the anode layer A11, and the capacitor electrode layer A9 is electrically connected to the drain electrode of the driving transistor through a via hole, the capacitor electrode layer A9 is electrically connected to the anode through a via hole, and the orthographic projection of the capacitor electrode layer A9 on the base substrate and the orthographic projection of the gate electrode of the driving transistor on the base substrate has an overlapping area to form a capacitor.

In at least one embodiment of the present disclosure, the power supply line and the capacitor electrode layer are arranged at the same layer and made of the same material, so that there is enough space in the source-drain metal layer to set the source electrode of the driving transistor and the drain electrode of the driving transistor, thereby setting the aspect ratio of the driving transistor to be larger, and improving the driving capability of the driving transistor.

In at least one embodiment of the present disclosure, the anode back plate for 3D printing further includes the first insulating layer, an organic resin layer, a conductive layer and a third insulating layer that are sequentially arranged between the drain electrode of the driving transistor and the capacitor electrode layer.

The organic resin layer and the conductive layer are used for blocking hydrogen; the orthographic projection of the organic resin layer on the base substrate covers the orthographic projection of the active layer pattern on the base substrate, the orthographic projection of the conductive layer on the base substrate covers the orthographic projection of the active layer pattern on the base substrate; the organic resin layer and the conductive layer prevent the active layer pattern from being damaged;

The drain electrode of the driving transistor is electrically connected to the conductive layer through a via hole penetrating the first insulating layer and the organic resin layer, and the conductive layer is electrically connected to the capacitor electrode layer through a via hole penetrating the third insulating layer.

In actual operation, the organic resin layer is used to improve the ability to block hydrogen and improve the stability of the anode back plate; the conductive layer covers the organic resin layer to improve the ability to block hydrogen, and can also prevent the lamination of the capacitor electrode layer from affecting the organic resin layer.

Optionally, the conductive layer may be made of ITO (indium tin oxide), and the organic resin layer may be made of an organic insulating material, but not limited thereto.

As shown in FIG. 3 and FIG. 14, the drain electrode D1 of the driving transistor is located in the source-drain metal layer A4, and the anode back plate for 3D printing according to at least one embodiment of the present disclosure further includes the first insulating layer A5, the organic resin layer A6, the conductive layer A7 and the third insulating layer A8 that are arranged in sequence between the source-drain metal layer A4 and the capacitor electrode layer A9;

The organic resin layer A6 and the conductive layer A7 are used to block hydrogen; the orthographic projection of the organic resin layer A6 on the base substrate covers the orthographic projection of the active layer pattern on the base substrate, the orthographic projection of the conductive layer A7 on the base substrate covers the orthographic projection of the active layer pattern on the base substrate;

The drain electrode of the driving transistor is electrically connected to the conductive layer A7 through a via hole penetrating the first insulating layer A5 and the organic resin layer A6, and the conductive layer A7 is electrically connected to the capacitor electrode layer A9 through a via hole penetrating the third insulating layer A8.

In at least one embodiment of the present disclosure, as shown in FIG. 2, FIG. 3, FIG. 4 and FIG. 14, the gate electrode G1 of the driving transistor, the gate electrode G2 of the switching transistor, the first gate line G01 and the second gate line G02 can be arranged on the gate metal layer A1; as shown in FIG. 2, FIG. 3, FIG. 6 and FIG. 14, the active layer pattern 51 of the driving transistor and the active layer pattern 52 of the switching transistor are arranged on the active layer A3; as shown in FIG. 2, FIG. 3, FIG. 7 and FIG. 14, the source electrode S1 of the driving transistor, the drain electrode D1 of the driving transistor, the source electrode S2 of the switching transistor and the drain electrode D2 of the switching transistor are all set on the source-drain metal layer A4; as shown in FIG. 2, FIG. 3, FIG. 10 and FIG. 14, the power supply line V1 and the capacitor electrode layer A9 are arranged at the same layer and made of the same material; FIG. 2, FIG. 3, FIG. 11 and FIG. 14, the anode is located in the anode layer A11;

The gate metal layer A1, the active layer A3, the source-drain metal layer A4, the capacitor electrode layer A9 and the anode layer A11 may be arranged on the base substrate in sequence.

In a specific implementation, two adjacent columns of pixel structures in the same row are symmetrically arranged on both sides of the power supply line;

Two pixel structures symmetrically arranged on both sides of the power supply line share one power supply line, and the power supply line is located between the two driving transistors symmetrically arranged; the source electrode of the two driving transistors symmetrically arranged extend in the row direction from one pixel structure to another pixel structure, and the source electrodes of the two driving transistors form an integral structure;

The power supply line further includes a first conductive connection portion, and the source electrode of the first driving transistor of the two driving transistors symmetrically arranged and the source electrode of the second driving transistor of the two driving transistors symmetrically arranged are electrically connected through the second conductive connection portion;

The orthographic projection of the first conductive connection portion on the base substrate at least partially overlaps the orthographic projection of the second conductive connection portion on the base substrate, and the first conductive connection portion is connected to the second conductive connection portion through a via hole, so that the source electrode of the driving transistor is electrically connected to the power supply line.

As shown in FIG. 2 and FIG. 3, the first pixel structure 21 and the second pixel structure 22 are symmetrically arranged on both sides of the power supply line V1;

The first pixel structure 21 and the second pixel structure 22 share one power supply line V1, and the power supply line V1 is located between the driving transistor of the first pixel structure 21 and the driving transistor of the second pixel structure 22; the source electrode S1 of the first pixel structure 21 of the driving transistor extends in the row direction from the first pixel structure 21 to the second pixel structure 22, and the power supply line V1, the driving transistor of the first pixel structure 21 and the driving transistor of the second pixel structure 22 form an integral structure;

As shown in FIG. 7, the source electrode S1 of the driving transistor of the first pixel structure 21 and the source electrode of the driving transistor of the second pixel structure 22 are electrically connected through a second conductive connection portion L2;

The power supply line further includes a first conductive connection portion L1, the orthographic projection of the first conductive connection portion L1 on the base substrate at least partially overlaps the orthographic projection of the second conductive connection portion L2 on the base substrate, the first conductive connection portion L1 is electrically connected to the second conductive connection portion L2 through a via hole, so that the source electrode S1 of the driving transistor is electrically connected to the power supply line V1.

In at least one embodiment of the present disclosure, the anode back plate for 3D printing may further include:

an isolation layer arranged above the active layer pattern of the driving transistor, the isolation layer is used to isolate the influence of impurities on the active layer pattern of the driving transistor; the isolation layer is a single-layer isolation layer or a multi-layer isolation layer, the single-layer isolation layer or the multi-layer isolation layer includes at least one of an organic resin layer, a metal layer or a metal oxide active layer.

In at least one embodiment of the present disclosure, the anode back plate for 3D printing may further include the first insulating layer, the organic resin layer, a conductive layer including metal and a third insulating layer that are sequentially arranged between the drain electrode of the driving transistor and the capacitor electrode layer; a second insulating layer is provided between the capacitive electrode layer and the anode;

The organic resin layer and the conductive layer are used as protective layers of the active layer pattern of the driving transistor to block hydrogen; the orthographic projection of the organic resin layer on the base substrate covers the orthographic projection of the active layer pattern of the driving transistor on the base substrate, the orthographic projection of the conductive layer on the base substrate covers the orthographic projection of the active layer pattern of the driving transistor on the base substrate;

The via holes between the first conductive connection portion and the second conductive connection portion include a first via hole, a second via hole and a third via hole; the first via hole penetrates through the first insulating layer, the second via hole penetrates the organic resin layer, and the third via hole penetrates the third insulating layer;

The orthographic projection of the first via hole on the base substrate, the orthographic projection of the second via hole on the base substrate, and the orthographic projection of the third via hole on the base substrate at least partially overlap to each other, so that the first conductive connection portion and the second conductive connection portion are electrically connected.

In FIG. 12 and FIG. 14, H01, H02, and H03 are the first via hole, the second via hole, and the third via hole, respectively.

As shown in FIG. 14, the anode back plate may include a conductive layer A7 and an organic resin layer A6; the conductive layer A7 is arranged on the side of the capacitor electrode layer A9 away from the base substrate 20; the organic resin layer A6 is arranged between the conductive layer A7 and the source-drain metal layer A4; the anode back plate further includes a first insulating layer A5 arranged between the source-drain metal layer A4 and the organic resin layer A6, and a third insulating layer A8 arranged between the conductive layer A7 and the capacitor electrode layer A9.

In FIG. 14, the gate metal layer is labeled A1, the gate insulating layer is labeled A2, the active layer is labeled A3, the second insulating layer is labeled A10, and the anode layer is labeled A11.

As shown in FIG. 12 and FIG. 14, the orthographic projection of the first via hole H01 on the base substrate 20 is within the orthographic projection of the second via hole H02 on the base substrate 20, the orthographic projection of the third via hole H03 on the base substrate 20 is within the orthographic projection of the second via hole H02 on the base substrate 20.

In at least one embodiment of the present disclosure, due to process limitations, the area of the orthographic projection of H02 on the base substrate is set to be larger than the area of the orthographic projection of H01 on the base substrate, and the area of the orthographic projection of H02 on the base substrate is set to be larger than the area of the orthographic projection of H03 on the base substrate, so as to ensure that H01 can be completely presented and can be completely etched.

In a specific implementation, as shown in FIG. 8, the conductive layer may include a plurality of conductive patterns 30 independent from each other; the orthographic projection of the conductive patterns 30 on the base substrate covers the pixel area provided with the pixel structure, the orthographic projection of the conductive pattern 30 on the base substrate covers the orthographic projection of the active layer pattern on the base substrate. Moreover, the openings between the conductive patterns 30 may expose the first conductive connection portion L1 and the second conductive connection portion L2 to avoid short circuits.

In a specific implementation, the active layer may be a metal oxide active layer, but not limited thereto.

Optionally, the active layer may be an IGZO layer, wherein the atomic number ratio of indium, gallium, zinc and oxygen may be 1:1:1:4, but not limited thereto.

In at least one embodiment of the present disclosure, the anode back plate for 3D printing may include a gate metal layer, the active layer, the source-drain metal layer, the capacitor electrode layer and the anode layer that are arranged in sequence on the base substrate, the gate metal layer includes a gate line, a gate electrode of the driving transistor and a gate electrode of the switching transistor, and the gate electrode of the driving transistor is multiplexed as the first electrode plate of the storage capacitor plate, the active layer includes the active layer pattern of the driving transistor and the active layer pattern of the switching transistor, and the capacitor electrode layer includes the power supply line and the first electrode plate portion of the second electrode plate of the storage capacitor; the source-drain metal layer includes the source electrode of the driving transistor, the drain electrode of the driving transistor, the source electrode of the switching transistor, the drain electrode of the switching transistor, and the second electrode plate portion of the second electrode plate of the storage capacitor; the anode layer includes a plurality of anodes independent from each other.

At least one embodiment of the present disclosure adopts a stacked structure of a gate metal layer, a capacitor electrode layer, and a source-drain metal layer to form a capacitor, so as to solve the problem that the source electrode of the driving transistor and the drain electrode of the driving transistor, the source electrode of the switching transistor, the drain electrode of the switching transistor, and the second electrode plate of the storage capacitor cannot only be arranged on the same layer due to the small area of the pixel structure.

As shown in FIG. 2 and FIG. 3, the first pixel structure 21 and the second pixel structure 22 are symmetrically arranged on both sides of the power supply line V1 extending along the column direction; the first pixel structure 21 and the second pixel structure 22 are arranged in the same row; the first pixel structure 21 includes a driving transistor, a switching transistor and a first data line D01; the second pixel structure 22 includes a driving transistor, a switching transistor and a second data line D02;

The first pixel structure 21 and the second pixel structure 22 share the first gate line G01 and the power supply line V1; the pixel structures in the same column may share the same data line.

As shown in FIG. 2, the anode back plate includes a gate metal layer A1, an active layer A3, a source-drain metal layer A4, a capacitor electrode layer A9 and an anode layer A11 that are sequentially arranged above the base substrate 20;

FIGS. 4 and 5 are top views of the gate metal layer in FIG. 2, FIG. 6 is a top view of the active layer in FIG. 2, FIG. 7 is a top view of the source-drain metal layer in FIG. 2, and FIG. 10 is a top view of the capacitor electrode layer in FIG. 2, FIG. 11 is the top view of the anode layer in FIG. 2.

The difference between the at least one embodiment of the anode back plate shown in FIG. 3 and the at least one embodiment of the anode back plate shown in FIG. 2 is that a conductive layer and an organic resin layer are added, and a second via hole and a second connection via hole are added.

In FIG. 4 and FIG. 5, G01 is the first gate line, G02 is the second gate line, and G1 is the gate electrode of the driving transistor in the first pixel structure 21. The gate electrode G1 of the driving transistor in the pixel structure 21 is multiplexed as the first electrode plate of the storage capacitor; in FIG. 4 and FIG. 5, G2 is the gate electrode of the switching transistor in the first pixel structure 21, and the gate electrode G2 of the switching transistor in the first pixel structure 21 is the protruding portion of G01; in FIG. 6, the active layer pattern of the driving transistor in the first pixel structure 21 is labeled 51; an active layer pattern of the switching transistor in the pixel structure is labeled 52; in FIG. 7, the source electrode of the driving transistor in the first pixel structure 21 is labeled S1, and the drain electrode of the driving transistor in the first pixel structure 21 is labeled D1, the source electrode of the switching transistor in the first pixel structure 21 is labeled S2, the drain electrode of the switching transistor in the first pixel structure 21 is labeled D2, the extension portion is labeled L3, the extension portion L3 is electrically connected to D2; in FIG. 7, S2 is the protruding portion of D01. In FIG. 8, the reference numeral 30 is a conductive pattern included in the conductive layer. In FIG. 10, L1 is the first conductive connection portion, and V1 is the power supply line arranged in the column direction. In FIG. 11, the anode is labeled 10.

As shown in FIG. 4 and FIG. 5, the main body portion of G01 is a linear portion extending in the row direction, and G2 and the main body portion of G01 are an integral structure and G2 protrudes from the main body portion of G01. As shown in FIG. 7, the main body portion of D01 is a linear portion extending in the column direction, and S2 and the main body portion of D01 are an integral structure and S2 protrudes from the main body portion of D01.

In at least one embodiment of the present disclosure, the column direction may be a vertical direction, the row direction may be a horizontal direction, the first side may be a left side, and the second side may be a right side, but not limited thereto.

As shown in FIG. 2 and FIG. 3, the first pixel structure 21 and the second pixel structure are symmetrically arranged on opposite sides of the power supply line V1, and a symmetrical pixel structure is adopted to save pixel area, and in at least one embodiment of the present disclosure, the power supply line is arranged on the capacitor electrode layer, so as to further save the pixel area and achieve better resolution.

As shown in FIG. 2, FIG. 3, FIG. 4, FIG. 5, FIG. 6 and FIG. 7, the active layer pattern of the driving transistor includes a first channel portion 511, a first electrode contact portion 512 and a second electrode contact portion 513;

The orthographic projection of the source electrode S1 of the driving transistor on the base substrate at least partially overlaps the orthographic projection of the first electrode contact portion 512 on the base substrate, and the orthographic projection of the drain electrode D1 of the driving transistor on the base substrate at least partially overlaps the orthographic projection of the second electrode contact portion 513 on the base substrate;

The source electrode S1 of the driving transistor is in direct contact with the first electrode contact portion 512, and the drain electrode D1 of the driving transistor is in direct contact with the second electrode contact portion 513;

The first channel portion 511 is arranged between the first electrode contact portion 512 and the second electrode contact portion 513;

The first channel portion 511 extends in the row direction.

As shown in FIG. 6, a ratio between the width of the first channel portion 511 in the row direction and the length of the first channel portion 511 in the column direction (this ratio is also the width-to-length ratio of the driving transistor) is greater than a predetermined ratio.

In at least one embodiment of the present disclosure, the power supply line and the capacitor electrode layer are arranged at the same layer and made of the same material, so that there is enough space for the source electrode of the driving transistor and the drain electrode of the driving transistor in the source-drain metal layer, so that the aspect ratio of the driving transistor is set to be larger to improve the driving capability.

In at least one embodiment shown in FIG. 2 and FIG. 3, the aspect ratio of the driving transistor may be greater than or equal to 4 and less than or equal to 8, for example, the aspect ratio of the driving transistor may be equal to 5, but not limited thereto.

In at least one embodiment of the present disclosure, the predetermined ratio may be greater than or equal to 1 and less than or equal to 12.5, but not limited thereto.

As shown in FIG. 7, the drain electrode D1 of the driving transistor and the second electrode plate portion C1b2 form an integral structure;

As shown in FIG. 2, FIG. 3, FIG. 7 and FIG. 10, there is a first overlapping area between the orthographic projection of the first electrode plate portion C1b1 on the base substrate and the orthographic projection of the second electrode plate portion C1b2 on the base substrate; the first electrode plate portion C1b1 and the power supply line V1 are independent of each other;

The first electrode plate portion C1b1 is electrically connected to the second electrode plate portion C1b2 through a connection via hole; the connection via hole is arranged in the first overlapping area;

As shown in FIG. 2, FIG. 3, FIG. 10, FIG. 11 and FIG. 12, there is a second overlapping area between the orthographic projection of the first electrode plate portion C1b1 on the base substrate and the orthographic projection of the pixel electrode 10 on the base substrate.

The first electrode plate portion C1b1 is electrically connected to the pixel electrode 10 through a fourth via hole H04 arranged in the second overlapping area.

In FIG. 14, H04 is a fourth via hole, and the fourth via hole H04 is a via hole penetrating the second insulating layer A10.

As shown in FIG. 3, FIG. 7, FIG. 8, FIG. 10 and FIG. 12, the second electrode plate portion C1b2 is electrically connected to the conductive pattern 30 through the first connection via hole H1 and the second connection via hole H2; the conductive pattern 30 is electrically connected to the first electrode plate portion C1a through the third connection via hole.

As shown in FIG. 12, the connection via holes may include a first connection via hole H1, a second connection via hole H2 and a third connection via hole; the orthographic projection of the first connection via hole H1 on the base substrate is within the orthographic projection of the second connection via hole H2 on the base substrate, and the orthographic projection of the third connection via hole on the base substrate is within the orthographic projection of the second connection via hole H2 on the base substrate.

In at least one embodiment corresponding to FIG. 12, the orthographic projection of the first connection via hole H1 on the base substrate overlaps the orthographic projection of the third connection via hole on the base substrate, but not limited to this. In actual operation, the orthographic projection of the first connection via hole on the base substrate may also at least partially overlap the orthographic projection of the third connection via hole on the base substrate.

As shown in FIG. 14, the first connection via hole H1 is a via hole penetrating the first insulating layer A5, the second connection via hole H2 is a via hole penetrating the organic resin layer A6, and the third connection via hole H3 is a via hole penetrating the third insulating layer A8;

The orthographic projection of the first connection via hole H1 on the base substrate is within the orthographic projection of the second connection via hole H2 on the base substrate, and the orthographic projection of the third connection via hole H3 on the base substrate is within the orthographic projection of the second connection via hole H2 on the base substrate.

In at least one embodiment of the present disclosure, due to the limitation of the process, the area of the orthographic projection of H2 on the base substrate is set to be larger than the area of the orthographic projection of H1 on the base substrate, and the area of the orthographic projection of H2 on the base substrate is set to be larger than the area of the orthographic projection of H3 on the base substrate, so as to ensure that H1 can be completely presented and can be completely etched.

As shown in FIG. 2, FIG. 3, FIG. 4, FIG. 5 and FIG. 7, the gate electrode G1 of the driving transistor is multiplexed as the first electrode plate of the storage capacitor; the second electrode plate portion C1b2 and the second electrode D1 of the driving transistor form an integral structure;

In FIG. 10, C1b1 is the first plate portion;

As shown in FIG. 2, FIG. 3, FIG. 4, FIG. 5, FIG. 7 and FIG. 10, the orthographic projection of the first electrode plate C1a on the base substrate, the orthographic projection of the first electrode plate portion C1b1 on the base substrate and the orthographic projection of the second electrode plate portion C1b2 on the base substrate at least partially overlap to each other, so as to be able to form a storage capacitor.

As shown in FIG. 2, FIG. 3, FIG. 4, FIG. 5, FIG. 6 and FIG. 7, the active layer pattern of the switching transistor includes a second channel portion 521 (that is, the channel of the active layer pattern of the switching transistor), the third electrode contact portion 522 and the fourth electrode contact portion 523;

The orthographic projection of the source electrode S2 of the switching transistor on the base substrate at least partially overlaps the orthographic projection of the third electrode contact portion 522 on the base substrate, and the orthographic projection of the drain electrode D2 of the switching transistor on the base substrate at least partially overlaps the orthographic projection of the fourth electrode contact portion 523 on the base substrate;

The source electrode S2 of the switching transistor is in direct contact with the third electrode contact portion 522, and the drain electrode D2 of the switching transistor is in direct contact with the fourth electrode contact portion 523;

The second channel portion 521 is arranged between the third electrode contact portion 522 and the fourth electrode contact portion 523.

As shown in FIG. 2, FIG. 3, FIG. 4, FIG. 5 and FIG. 7, the drain electrode D2 of the switching transistor is electrically connected to the extension portion L3, and there is a third overlapping area between the orthographic projection of the extension portion L3 on the base substrate and the orthographic projections of the first electrode plate of the storage capacitor (that is, the gate electrode G1 of the driving transistor) on the base substrate, and the first electrode plate of the storage capacitor is electrically connected to the extension portion L3 through the fourth connection via hole H4 in the third overlapping area, so that the first electrode plate of the storage capacitor is electrically connected to the second electrode D2 of the switching transistor.

In FIG. 14, H4 is the fourth connection via hole, and the fourth connection via hole H4 is a via hole penetrating the gate insulating layer A2.

In at least one embodiment of the present disclosure, as shown in FIG. 9, the conductive layer includes a plurality of conductive patterns 30 independent from each other, and the orthographic projection of the conductive pattern 30 on the base substrate covers the pixel area provided with the pixel structure, the orthographic projection of the conductive pattern 30 on the base substrate covers the orthographic projection of the active layer pattern on the base substrate; and as shown in FIG. 9, the openings arranged between the conductive patterns 30 expose the first conductive connection portion and the second conductive connection portion to prevent short circuits.

In at least one embodiment of the anode back plate shown in FIG. 3, the structure of the conductive layer can be replaced with the structure shown in FIG. 16.

As shown in FIG. 16, the conductive layer may include a plurality of first openings K1 and a plurality of second openings K2, the third connection via hole passes through the first openings K1; the second opening K2 expose the first conductive connection portion and the second conductive connection portion to avoid short circuit.

Using the structure of the conductive layer shown in FIG. 16, the second electrode plate portion can be directly electrically connected to the first electrode plate portion through the first connection via hole, the second connection via hole and the third connection via hole, the conductive layer is not necessary for connection. Therefore, when manufacturing the substrate according to at least one embodiment of the present disclosure, the first insulating layer and the organic resin layer may be formed in sequence on the side of the source-drain metal layer away from the base substrate, then form a second connection via hole penetrating the organic resin layer, and then form the third insulating layer on the side of the organic resin layer away from the first insulating layer, and then forming a first connection via hole penetrating the first insulating layer and a third connection via hole penetrating the third insulating layer by using the same dry etching process, in this way, a mask can be saved and production costs can be saved.

As shown in FIG. 16, the conductive patterns 30 included in the conductive layer may be continuous with each other, which can improve pixel uniformity.

In actual operation, in order to avoid the problem of ESD (Electro-Static discharge), the conductive pattern may be connected to a suitable potential, for example, the conductive pattern may be grounded, but not limited thereto.

In at least one embodiment of the present disclosure, on the premise of not affecting the characteristics of a TFT, the conductive pattern can also be electrically connected to other voltage signal lines in the display panel.

In at least one embodiment of the present disclosure, the conductive layer does not serve as a connection layer between metal layers, and the capacitor electrode layer is directly electrically connected to the anode layer through a via hole, which can reduce contact resistance.

In at least one embodiment of the present disclosure, as shown in FIG. 2 and FIG. 3, V21 is the first power supply line extending in the row direction, and V22 is the second power supply line extending in the row direction. In at least one embodiment of the present disclosure, the power supply lines may be arranged in a grid shape, the first conductive connection portion L1 is arranged between V21 and V22, the length of L1 along the row direction is greater than the length of V1 along the row direction, and the length of L1 along the column direction is greater than the length of V21 along the column direction, and the length of L1 along the column direction is greater than the length of V22 along the column direction, but not limited thereto. L1, V21, V22 and V1 are electrically connected.

In at least one embodiment of the present disclosure, the power supply lines are arranged in a grid shape to maximize the line width, and low-resistance metals can be used to make the power supply lines to reduce the IR voltage drop under high current (IR voltage drop refers to the phenomenon in which the voltage drops or rises on the power and ground networks in integrated circuits), improve the uniformity of a large-sized anode back plate.

In at least one embodiment of the present disclosure, the 3D printing system may include a printing box and the above-mentioned anode back plate for 3D printing; the printing box accommodates an electrolyte; the printing box includes a first cover plate and a second cover plate;

The anode back plate is arranged on the side of the first cover plate close to the second cover plate, so that each anode of the anode back plate faces the electrolyte;

A cathode for printing is provided on the side of the second cover plate close to the first cover plate.

In a specific implementation, the back plate includes a pixel structure and a pixel electrode arranged on the base substrate; the pixel structure is used to control the connection or disconnection between the power supply line and pixel electrode according the data voltage on the data line in a corresponding column under the control of according to the gate driving signal on the gate line in the corresponding row, so as to control the position of the metal ions to be printed in the electrolyte deposited on the second cover plate, and finally form a 3D pattern to achieve high precision printing.

In at least one embodiment of the present disclosure, the 3D printing system may further include a cathode back plate; the anode back plate and the cathode back plate are arranged opposite to each other;

The cathode back plate is arranged on the side of the second cover plate close to the first cover plate, and the cathode is arranged on the side of the cathode back plate close to the anode back plate.

In at least one embodiment of the present disclosure, the anode may be an electrochemical anode, and the anode back plate may be a TFT array substrate. By controlling the on/off of the driving transistor in the pixel structure in the anode back plate, the current conduction path is controlled, so as to control the position where the metal ions to be printed in the electrolyte are deposited on the cathode back plate, and finally form a 3D pattern.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It will be understood that when an element such as a layer, film, area or substrate is referred to as being "on" or "under" another element, it can be "directly on" or "under" the other element, or an intermediate element may be present.

In the foregoing description of the embodiments, the particular features, structures, materials or characteristics may be combined in any suitable manner in any one or more of the embodiments or examples.

The above are the preferred embodiments of the present disclosure. Obviously, a person skilled in the art may make further modifications and improvements without departing from the principle of the present disclosure, and these modifications and improvements shall also fall within the scope of the present disclosure.

What is claimed is:

1. A back plate, comprising a base substrate, gate lines, data lines and power supply lines arranged on the base substrate crossing each other in rows and columns, and pixel structures arranged in an array on the base substrate, wherein
each pixel structure includes a driving transistor, a switching transistor connected to the driving transistor, and a pixel electrode connected to the driving transistor; a gate line and a data line are connected to the switching transistor, and a power supply line is connected to the driving transistor;
in a same row of pixel structures or a same column of pixel structures, a power supply line is arranged between an (2n−1)th pixel structure and an 2n-th pixel structure, and the power supply line is connected to a source electrode of a driving transistor in the (2n−1)th pixel structure and a source electrode of a driving transistor in the 2n-th pixel structure; n is a positive integer greater than or equal to 1;
wherein, in a pixel area where the pixel structure is located, the driving transistor and the switching transistor are arranged in sequence along the column direction, a gate electrode of the driving transistor extends in the row direction from the data line to the power supply line, and the gate electrode of the driving transistor extends in the column direction from the gate line of a previous row of pixel structures to the switching transistor;

a width direction of a channel in an active layer pattern of the driving transistor is consistent with the row direction, and the channel extends in the row direction from the data line arranged on one side of the pixel structure to the power supply line arranged on the other side of the pixel structure;

the gate electrode of the driving transistor is connected to a drain electrode of the switching transistor, the source electrode of the driving transistor is electrically connected to the power supply line, and the drain electrode of the driving transistor is electrically connected to the pixel electrode;

a source electrode of the switching transistor is electrically connected to the data line, and a gate electrode of the switching transistor is electrically connected to a gate line;

wherein a length of the gate electrode of the driving transistor in the column direction is greater than a length of the active layer pattern of the driving transistor in the column direction, so that the gate electrode of the driving transistor extends towards the switching transistor relative to the active layer thereby forming an extension portion of the gate electrode of the driving transistor, and orthographic projections of the extension portion of the gate electrode and the active layer pattern of the driving transistor on the base substrate are non-overlapping with each other;

the drain electrode of the driving transistor is electrically connected to the pixel electrode through a capacitor electrode layer;

orthographic projections of the capacitor electrode layer and the extension portion on the base substrate at least partially overlap with each other, and the capacitor electrode layer at least forms a capacitance with the extension portion of the gate electrode.

2. The back plate according to claim 1, wherein the driving transistor in the (2n−1)th pixel structure is a first driving transistor, and the driving transistor in the 2n-th pixel structure is a second driving transistor;

the power supply line and a source electrode of the first driving transistor are located on different layers, the power supply line and a source electrode of the second driving transistor are located on different layers, and the power supply line is connected to the source electrode of the first driving transistor and the source electrode of the second driving transistor through a via hole.

3. The back plate according to claim 2, wherein the source electrode of the first driving transistor and the source electrode of the second driving transistor are located on a same layer, the source electrode of the first driving transistor is connected to the source electrode of the second driving transistor, and a position where the power supply line and the source electrode are connected through the via hole is a position where the source electrode of the first driving transistor and the source electrode of the second driving transistor are connected.

4. The back plate according to claim 1, wherein the gate lines extend along a row direction of the array, and the data lines and the power supply lines extend along a column direction of the array; two data lines respectively connected to a switching transistor in the 2n-th pixel structure and a switching transistor in a (2n+1)th pixel structure are arranged between the 2n-th pixel structure and the (2n+1)th pixel structure, two data lines respectively connected to a switching transistor in the (2n−1)th pixel structure and a switching transistor in a (2n−2)th pixel structure are arranged between the (2n−1)th pixel structure and the (2n−2)th pixel structure.

5. The back plate according to claim 1, wherein the gate line has a first protruding portion, the data line has a second protruding portion, the gate electrode of the switching transistor is the first protruding portion, and the source electrode of the switching transistor is the second protruding portion; a width direction of a channel of an active layer pattern of the switching transistor is perpendicular to the width direction of the channel of the driving transistor;

the switching transistor further includes an extension portion connected to the drain electrode, the extension portion extends from the switching transistor to the power supply line, and the drain electrode of the switching transistor is connected to the gate electrode of the driving transistor through the extension portion.

6. The back plate according to claim 1, wherein the pixel electrode is an anode;

the gate line extends along the row direction of the array and is located on a side of the pixel structure close to a next row of pixel structures; the data lines extends along the column direction of the array, the power supply line includes a power supply line extending along the column direction; the data line and the power supply line extending along the column direction are located on opposite sides of the pixel structure;

in a pixel area where the pixel structure is located, the driving transistor and the switching transistor are arranged in sequence along the column direction;

a gate electrode of the driving transistor extends in the row direction from the data line to the power supply line, and the gate electrode of the driving transistor extends in the column direction from the gate line of a previous row of pixel structures to the switching transistor;

a width direction of a channel in an active layer pattern of the driving transistor is the row direction, and the channel extends in the row direction from the data line located on one side of the pixel structure to the power supply line located on the other side of the pixel structure;

a gate electrode of the driving transistor is connected to a drain electrode of the switching transistor, the source electrode of the driving transistor is electrically connected to the power supply line, and the drain electrode of the driving transistor is electrically connected to the pixel electrode;

a source electrode of the switching transistor is electrically connected to the data line, and a gate electrode of the switching transistor is electrically connected to the gate line;

wherein the gate line has a first protruding portion, and the data line has a second protruding portion;

a width direction of a channel of an active layer pattern of the switching transistor is perpendicular to the width direction of the channel of the driving transistor, the gate electrode of the switching transistor is the first protruding portion, and the source electrode of the switching transistor is the second protruding portion;

the drain electrode of the switching transistor includes an extension portion;

the extension portion is part of a unitary structure of the drain electrode of the switching transistor, the extension portion extends toward the power supply line, and an orthographic projection of the extension portion on the base substrate at least partially overlaps an orthographic projection of the gate electrode of the driving transistor on the base substrate, and the drain electrode of the switching transistor is electrically connected to the gate electrode of the driving transistor through a via hole.

7. The back plate according to claim 1, wherein a position of a driving transistor in the (2n−1)th pixel structure and a position of a driving transistor in the 2n-th pixel structure in a pixel area where the pixel structure is located are symmetrical with respect to a power supply line between the (2n−1)th pixel structure and the 2n-th pixel structure; a position of a switching transistor in the (2n−1)th pixel structure and a position of a switching transistor in the 2n-th pixel structure in the pixel area are symmetrical with respect to the power supply line between the (2n−1)th pixel structure and the 2n-th pixel structure.

8. The back plate according to claim 1, wherein the capacitor electrode layer is located between the drain electrode of the driving transistor and the pixel electrode, a first insulating layer is provided between the capacitor electrode layer and the drain electrode of the driving transistor, and a second insulating layer is arranged between the capacitor electrode layer and the pixel electrode;
the capacitor electrode layer is electrically connected to the drain electrode of the driving transistor through a via hole provided in the first insulating layer, and the capacitor electrode layer is electrically connected to the pixel electrode through a via hole provided in the second insulating layer;
there is an overlapping area between an orthographic projection of the capacitor electrode layer on the base substrate and an orthographic projection of the gate electrode of the driving transistor on the base substrate;
wherein the power supply line and the capacitor electrode layer are arranged at a same layer and made of a same material.

9. The back plate according to claim 1, further comprising a first insulating layer, an organic resin layer, a conductive layer, and a third insulating layer that are sequentially arranged between the drain electrode of the driving transistor and the capacitor electrode layer;
an orthographic projection of the organic resin layer on the base substrate covers an orthographic projection of the active layer pattern on the base substrate, and an orthographic projection of the conductive layer on the base substrate covers an orthographic projection of the active layer pattern on the base substrate;
the drain electrode of the driving transistor is electrically connected to the conductive layer through a via hole penetrating the first insulating layer and the organic resin layer, and the conductive layer is electrically connected to the capacitor electrode layer through a via hole penetrating the third insulating layer.

10. The back plate according to claim 1, wherein a gate electrode of the driving transistor, a gate electrode of the switching transistor and the gate line are arranged on a same layer on the base substrate, and made of a same material; an active layer pattern of the driving transistor and an active layer pattern of the switching transistor are arranged above a film layer where the gate electrode is located; a source electrode of the driving transistor, a drain electrode of the driving transistor, a source electrode of the switching transistor and a drain electrode of the switching transistor are all arranged on a same layer, the power supply line and a capacitor electrode layer are arranged at a same layer, the power supply line is located above the source electrode of the driving transistor, and is connected to the source electrode of the driving transistor through a via hole, and the pixel electrode is arranged above the power supply line and the capacitor electrode layer;
the drain electrode of the driving transistor is electrically connected to the pixel electrode through the capacitor electrode layer, and there is an overlapping area between an orthographic projection of the capacitor electrode layer on the base substrate and an orthographic projection of an extension portion of the gate electrode of the driving transistor relative to the active layer on the base substrate, to form a capacitor;
the drain electrode of the switching transistor is electrically connected to the gate electrode of the driving transistor through an extension portion extending towards the power supply line;
wherein two adjacent columns of pixel structures in the same row are symmetrically arranged on both sides of the power supply line;
two pixel structures symmetrically arranged on both sides of the power supply line share one power supply line, and the power supply line is located between two driving transistors arranged symmetrically; the source electrodes of the two driving transistors arranged symmetrically extend in the row direction from one pixel structure to another pixel structure;
the power supply line further includes a first conductive connection portion, and a source electrode of a first driving transistor of the two driving transistors arranged symmetrically and a source electrode of a second driving transistor of the two driving transistors arranged symmetrically are electrically connected through a second conductive connection portion;
an orthographic projection of the first conductive connection portion on the base substrate at least partially overlaps an orthographic projection of the second conductive connection portion on the base substrate, and the first conductive connection portion is connected to the second conductive connection portion through a via hole, the source electrode of the driving transistor is electrically connected to the power supply line.

11. The back plate according to claim 10, further comprising a first insulating layer, an organic resin layer, and a conductive layer including a metal and a third insulating layer sequentially arranged between the drain electrode of the driving transistor and the capacitor electrode layer; wherein a second insulating layer is arranged between the capacitor electrode layer and the pixel electrode;
the organic resin layer and the conductive layer are used as protective layers of the active layer pattern of the driving transistor to block hydrogen; an orthographic projection of the organic resin layer on the base substrate covers an orthographic projection of the active layer pattern of the driving transistor on the base substrate, an orthographic projection of the conductive layer on the base substrate covers the orthographic projection of the active layer pattern of the driving transistor on the base substrate;
via holes between the first conductive connection portion and the second conductive connection portion includes a first via hole, a second via hole and a third via hole;
the first via hole penetrates through the first insulating layer, the second via hole penetrates through the organic resin layer, and the third via hole penetrates through the third insulating layer;

an orthographic projection of the first via hole on the base substrate, an orthographic projection of the second via hole on the base substrate, and an orthographic projection of the third via hole on the base substrate at least partially overlap;

wherein the orthographic projection of the first via hole on the base substrate is within the orthographic projection of the second via hole on the base substrate, the orthographic projection of the third via hole on the base substrate is within the orthographic projection of the second via hole on the base substrate;

wherein the conductive layer includes a plurality of conductive patterns independent from each other; an orthographic projection of the plurality of conductive patterns on the base substrate covers a pixel area where the pixel structure is located.

12. The back plate according to claim 1, further comprising:
an isolation layer arranged above an active layer pattern of the driving transistor, wherein the isolation layer is used to isolate impurities from affecting the active layer pattern of the driving transistor; the isolation layer is a single-layer isolation layer or a multi-layer isolation layer, and the single-layer isolation layer or the multi-layer isolation layer includes at least one of an organic resin layer, a metal layer or a metal oxide active layer; the multi-layer isolation layer is a double-layer isolation layer, the double-layer isolation layer includes the organic resin layer and the metal oxide active layer subsequently arranged above the active layer;
the metal oxide active layer or metal layer in the isolation layer includes an isolation portion arranged above the active layer pattern of the driving transistor of each pixel structure;
a plurality of isolation portions are independent of each other, or all isolation portions are integrally formed.

13. The back plate according to claim 1, comprising a gate metal layer, an active layer, an etch barrier layer, a source-drain metal layer, a capacitor electrode layer, and a pixel electrode layer that are sequentially arranged on the base substrate; wherein the etching barrier layer is used to protect the active layer from being etched;
the active layer is electrically connected to the source-drain metal layer through a via hole penetrating the etching barrier layer; a gate electrode of the driving transistor and a gate electrode of the switching transistor are arranged on the gate metal layer; an active layer pattern of the driving transistor and an active layer pattern of the switching transistor are arranged on the active layer; a source electrode of the driving transistor, a drain electrode of the driving transistor, a source electrode of the switching transistor and a drain electrode of the switching transistors are all arranged on the source-drain metal layer; the power supply lines are arranged on the capacitor electrode layer, the pixel electrode is arranged on a pixel electrode player;
pixel electrodes included in different pixel structures are independent of each other;
the drain electrode of the driving transistor is electrically connected to the pixel electrode through the capacitor electrode layer, and there is an overlapping area between an orthographic projection of the capacitor electrode layer on the base substrate and an orthographic projection of the gate electrode of the driving transistor on the base substrate;
the drain electrode of the switching transistor is electrically connected to the gate electrode of the driving transistor through an extension portion extending towards the power supply line.

14. An anode back plate for 3D printing, comprising a base substrate, gate lines, data lines and power supply lines arranged on the base substrate crossing to each other in rows and columns, and pixel structures arranged in an array on a base substrate;
each pixel structure includes a pixel electrode of the anode back plate located on the base substrate, a driving transistor electrically connected to the pixel electrode, and a switching transistor electrically connected to the driving transistor; the pixel electrode is an anode;
the gate line extends along a row direction of the array and is located on a side of the pixel structure close to a next row of pixel structures; the data line extends along a column direction of the array, the power supply line includes a power supply line extending along the column direction; the data line and the power supply line extending along the column direction are located on opposite sides of the pixel structure;
in a pixel area where the pixel structure is located, the driving transistor and the switching transistor are arranged in sequence along the column direction;
a gate electrode of the driving transistor extends in the row direction from the data line to the power supply line, and the gate electrode of the driving transistor extends in the column direction from the gate line of a previous row of pixel structures to the switching transistor;
a width direction of a channel in an active layer pattern of the driving transistor is the row direction, and the channel extends in the row direction from the data line located on one side of the pixel structure to the power supply line located on the other side of the pixel structure;
a gate electrode of the driving transistor is connected to a drain electrode of the switching transistor, a source electrode of the driving transistor is electrically connected to the power supply line, and the drain electrode of the driving transistor is electrically connected to the pixel electrode;
a source electrode of the switching transistor is electrically connected to the data line, and a gate electrode of the switching transistor is electrically connected to the gate line;
the drain electrode of the driving transistor is electrically connected to the pixel electrode through a capacitor electrode layer;
there is an overlapping area on the base substrate between the capacitor electrode layer and an extension portion of the gate electrode of the driving transistor, and the capacitor electrode layer at least forms a capacitor with the extension portion of the gate electrode of the driving transistor;
the anode back plate for 3D printing further includes a conductive layer including a metal arranged between the drain electrode of the driving transistor and the capacitor electrode layer; an orthographic projection of the conductive layer on the base substrate covers an orthographic projection of the active layer pattern on the base substrate.

15. The anode back plate for 3D printing according to claim 14, wherein the conductive layer includes a plurality of conductive patterns independent from each other; an orthographic projection of the conductive pattern on the base substrate covers the orthographic projection of the active layer pattern on the base substrate.

16. The anode back plate for 3D printing according to claim 14, wherein conductive patterns included in the conductive layer are continuous, and the orthographic projection of the conductive pattern on the base substrate covers the orthographic projection of the active layer pattern on the base substrate.

17. The anode back plate for 3D printing according to claim 16, further comprising: an organic resin layer;
wherein the conductive layer is arranged on a side of the capacitor electrode layer away from the base substrate, the organic resin layer is arranged between the conductive layer and a source-drain metal layer; the anode back plate further comprises a first insulating layer arranged between the source-drain metal layer and the organic resin layer, and a third insulating layer arranged between the conductive layer and the capacitor electrode layer;
the conductive layer and the organic resin layer are used for blocking hydrogen;
the source electrode of the driving transistor, the drain electrode of the driving transistor, the source electrode of the switching transistor and the drain electrode of the switching transistor are arranged on the source-drain metal layer;
wherein the pixel structure further comprises a storage capacitor, and the gate electrode of the driving transistor is multiplexed as a first electrode plate of the storage capacitor;
the capacitor electrode layer comprises a first electrode plate portion in a second electrode plate of the storage capacitor; a second electrode plate portion in the second electrode plate of the storage capacitor is arranged on the source-drain metal layer;
the second electrode plate portion is electrically connected to the conductive pattern through a first connection via hole and a second connection via hole in turn, and the conductive pattern is electrically connected to the first electrode plate portion through a third connection via hole;
the first connection via hole is a via hole penetrating the first insulating layer, the second connection via hole is a via hole penetrating the organic resin layer, and the third connection via hole is a via hole penetrating the third insulating layer;
an orthographic projection of the first connection via hole on the base substrate, an orthographic projection of the second connection via hole on the base substrate, and an orthographic projection of the third connection via hole on the base substrate at least partially overlap;
the conductive layer includes a first opening, and the third connection via hole passes through the first opening;
wherein the orthographic projection of the first connection via hole on the base substrate is within the orthographic projection of the second connection via hole on the substrate, the orthographic projection of the third connection via hole on the base substrate is within the orthographic projection of the second connection via hole on the base substrate.

18. The anode back plate for 3D printing according to claim 14, wherein two adjacent columns of pixel structures in the same row are symmetrically arranged on both sides of the power supply line;
two pixel structures symmetrically arranged on both sides of the power supply line share one power supply line, and the power supply line is located between two driving transistors symmetrically arranged; source electrodes of the two driving transistors symmetrically arranged extend in the row direction from one pixel structure to another pixel structure, and the source electrodes of the two driving transistors form an integral structure;
the power supply line further includes a first conductive connection portion, and a source electrode of a first driving transistor of the two driving transistors symmetrically arranged and a source electrode of a second driving transistor of the two driving transistors symmetrically arranged are electrically connected through a second conductive connection portion;
the orthographic projection of the first conductive connection portion on the base substrate at least partially overlaps the orthographic projection of the second conductive connection portion on the base substrate, and the first conductive connection portion is connected to the second conductive connection portion through a via hole, the source electrode of the driving transistor is electrically connected to the power supply line;
wherein the conductive layer has a second opening; the second opening exposes the first conductive connection portion and the second conductive connection portion.

19. A back plate, comprising a base substrate, gate lines, data lines and power supply lines arranged on the base substrate crossing each other in rows and columns, and pixel structures arranged in an array on the base substrate, wherein
each pixel structure includes a driving transistor, a switching transistor connected to the driving transistor, and a pixel electrode connected to the driving transistor; a gate line and a data line are connected to the switching transistor, and a power supply line is connected to the driving transistor;
in a same row of pixel structures or a same column of pixel structures, a power supply line is arranged between an (2n−1)th pixel structure and an 2n-th pixel structure, and the power supply line is connected to a source electrode of a driving transistor in the (2n−1)th pixel structure and a source electrode of a driving transistor in the 2n-th pixel structure; n is a positive integer greater than or equal to 1;
wherein a gate electrode of the driving transistor, a gate electrode of the switching transistor and the gate line are arranged on a same layer on the base substrate, and made of a same material; an active layer pattern of the driving transistor and an active layer pattern of the switching transistor are arranged above a film layer where the gate electrode is located; a source electrode of the driving transistor, a drain electrode of the driving transistor, a source electrode of the switching transistor and a drain electrode of the switching transistor are all arranged on a same layer, the power supply line and a capacitor electrode layer are arranged at a same layer, the power supply line is located above the source electrode of the driving transistor, and is connected to the source electrode of the driving transistor through a via hole, and the pixel electrode is arranged above the power supply line and the capacitor electrode layer;
the drain electrode of the driving transistor is electrically connected to the pixel electrode through the capacitor electrode layer, and there is an overlapping area between an orthographic projection of the capacitor electrode layer on the base substrate and an orthographic projection of an extension portion of the gate electrode of the driving transistor relative to the active layer on the base substrate, to form a capacitor;

the drain electrode of the switching transistor is electrically connected to the gate electrode of the driving transistor through an extension portion extending towards the power supply line;

wherein two adjacent columns of pixel structures in the same row are symmetrically arranged on both sides of the power supply line;

two pixel structures symmetrically arranged on both sides of the power supply line share one power supply line, and the power supply line is located between two driving transistors arranged symmetrically; the source electrodes of the two driving transistors arranged symmetrically extend in the row direction from one pixel structure to another pixel structure;

the power supply line further includes a first conductive connection portion, and a source electrode of a first driving transistor of the two driving transistors arranged symmetrically and a source electrode of a second driving transistor of the two driving transistors arranged symmetrically are electrically connected through a second conductive connection portion;

an orthographic projection of the first conductive connection portion on the base substrate at least partially overlaps an orthographic projection of the second conductive connection portion on the base substrate, and the first conductive connection portion is connected to the second conductive connection portion through a via hole, the source electrode of the driving transistor is electrically connected to the power supply line.

* * * * *